US010621909B2

(12) United States Patent
Kwon et al.

(10) Patent No.: US 10,621,909 B2
(45) Date of Patent: Apr. 14, 2020

(54) DISPLAY DEVICE AND METHOD OF FABRICATING THE SAME

(71) Applicant: Samsung Display Co., Ltd., Yongin-Si, Gyeonggi-Do (KR)

(72) Inventors: Seungwook Kwon, Hwaseong-si (KR); Ohjune Kwon, Hwaseong-si (KR); Hyojeong Kwon, Seoul (KR); Doohwan Kim, Yongin-si (KR); Minsang Kim, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 54 days.

(21) Appl. No.: 15/966,532

(22) Filed: Apr. 30, 2018

(65) Prior Publication Data

US 2019/0057645 A1 Feb. 21, 2019

(30) Foreign Application Priority Data

Aug. 18, 2017 (KR) .................. 10-2017-0104988

(51) Int. Cl.
*G09G 3/3225* (2016.01)
*H01L 51/52* (2006.01)
*H01L 51/56* (2006.01)
*H01L 51/00* (2006.01)
*H01L 27/32* (2006.01)

(52) U.S. Cl.
CPC ....... *G09G 3/3225* (2013.01); *H01L 27/3223* (2013.01); *H01L 51/003* (2013.01); *H01L 51/0096* (2013.01); *H01L 51/529* (2013.01); *H01L 51/5246* (2013.01); *H01L 51/56* (2013.01); *G09G 2300/04* (2013.01); *G09G 2300/0413* (2013.01); *G09G 2310/0264* (2013.01)

(58) Field of Classification Search
CPC combination set(s) only.
See application file for complete search history.

(56) References Cited

U.S. PATENT DOCUMENTS

| 5,325,583 | A | 7/1994 | Shimizu et al. |
| 9,274,559 | B2 | 3/2016 | Prushinskiy et al. |
| 2006/0038742 | A1* | 2/2006 | Lowles .................... G09G 3/00 345/1.3 |

(Continued)

FOREIGN PATENT DOCUMENTS

| KR | 1019940004052 B1 | 5/1994 |
| KR | 1020150019876 A | 2/2015 |

(Continued)

OTHER PUBLICATIONS 63-055549 abstract only Feb. 1988.*

*Primary Examiner* — Van N Chow
(74) *Attorney, Agent, or Firm* — Cantor Colburn LLP

(57) ABSTRACT

A display device includes a display panel, a protection member, and an adhesive member between the protection member and the display panel. The display panel includes a first region, in which effective pixels are provided, a second region, in which ineffective pixels are provided, and a third region, in which a pixel is absent. The protection member is provided on a rear surface of the display panel and defines a first groove corresponding to the second region. The protection member includes a thermoplastic resin.

20 Claims, 27 Drawing Sheets

(56) References Cited

U.S. PATENT DOCUMENTS

| | | | |
|---|---|---|---|
| 2015/0169089 A1* | 6/2015 | Dixon | H04B 1/3888 |
| | | | 428/137 |
| 2015/0227172 A1 | 8/2015 | Namkung et al. | |
| 2016/0118416 A1* | 4/2016 | Yamazaki | H01L 27/1218 |
| | | | 349/38 |
| 2017/0064884 A1* | 3/2017 | Kim | H05K 13/041 |
| 2018/0047938 A1* | 2/2018 | Kishimoto | H01L 27/323 |
| 2019/0033493 A1 | 1/2019 | Kwon et al. | |

FOREIGN PATENT DOCUMENTS

| | | |
|---|---|---|
| KR | 1020150094989 A | 8/2015 |
| KR | 1020170038605 A | 4/2017 |
| KR | 1020190014273 A | 2/2019 |

\* cited by examiner

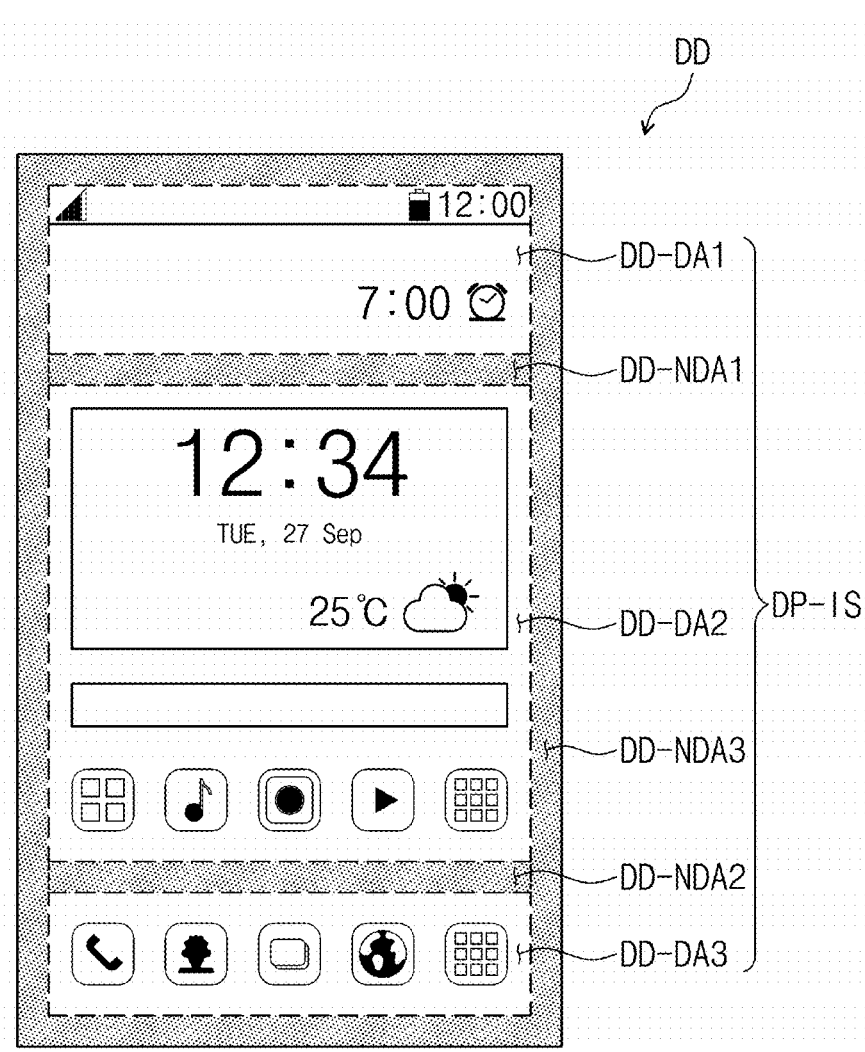

DISPLAY DEVICE AND METHOD OF FABRICATING THE SAME

This application claims priority to Korean Patent Application No. 10-2017-0104988, filed on Aug. 18, 2017, and all the benefits accruing therefrom under 35 U.S.C. § 119, the content of which in its entirety is herein incorporated by reference.

BACKGROUND

1. Field

Exemplary embodiments of the invention relate to a display device and a method of fabricating the same, and in particular, to a display device with ineffective pixels and a method of fabricating the same.

2. Description of the Related Art

Electronic devices, such as smart phones, tablets, notebook computers, and smart television sets, are being developed. The electronic devices generally include a display device that is used to provide information to a user. The electronic device further includes various electronic modules, in addition to the display device.

To design a bezel of the electronic devices in a shape suitable for a specific purpose, a design of a module, such as a display device and a window, may be variously changed.

SUMMARY

Some exemplary embodiments of the invention provide a display device, in which ineffective pixels are used to realize a non-display region.

Some exemplary embodiments of the invention provide a method of fabricating the display device.

According to an exemplary embodiment of the invention, a display device may include a display panel, a protection member, and an adhesive member between the protection member and the display panel. The display panel may include a first region, in which effective pixels are provided, a second region, in which ineffective pixels are provided, and a third region, in which a pixel is absent. The protection member may be disposed on a rear surface of the display panel and define a first groove corresponding to the second region, and the protection member may include a thermoplastic resin.

In an exemplary embodiment, each of the effective pixels and the ineffective pixels may include an organic light emitting diode and a pixel driving circuit connected to the organic light emitting diode, and the pixel driving circuits of the effective pixels may have a same structure as that of the pixel driving circuits of the ineffective pixels.

In an exemplary embodiment, the thermoplastic resin may include polyethylene terephthalate.

In an exemplary embodiment, a portion of the rear surface of the display panel corresponding to the second region may be exposed to an outside.

In an exemplary embodiment, a second groove is defined in the adhesive member corresponding to the second region.

In an exemplary embodiment, a rear surface of the protection member may include a first rear region and a second rear region, between which the first groove is interposed, and the protection member may further include a bump portion disposed adjacent to the first groove. The bump portion is protruded from the first rear region and the second rear region.

In an exemplary embodiment, the protection member may include a first inner side surface and a second inner side surface defining the first groove, and the first inner side surface and the second inner side surface may be inclined.

In an exemplary embodiment, the display panel may further include a fourth region, in which effective pixels are provided, and the second region may be located between the first region and the fourth region.

In an exemplary embodiment, the fourth region may be bent from the first region.

In an exemplary embodiment, the display device may further include a window unit provided on the display panel. The window unit may include a base film, which is provided to face the protection member with the display panel interposed therebetween, and a light-blocking pattern, which is provided on a rear surface of the base film. The light-blocking pattern may be spaced apart from the second region in a plan view.

In an exemplary embodiment, the first groove may overlap with a portion of the third region.

According to an exemplary embodiment of the invention, a display device may include a display panel, a protection member, and an adhesive member provided between the protection member and the display panel. The display panel may include an effective pixel region, in which effective pixels are provided, an ineffective pixel region, in which ineffective pixels are provided, and a peripheral region, in which a pixel is absent. The protection member may be provided on a rear surface of the display panel and define a groove corresponding to the ineffective pixel region.

In an exemplary embodiment, the effective pixel region may include a first effective pixel region and a second effective pixel region, and the ineffective pixel region may be provided between the first effective pixel region and the second effective pixel region.

In an exemplary embodiment, the second effective pixel region may be bent from the first effective pixel region.

In an exemplary embodiment, the ineffective pixel region may include a line-shaped region extending in a predetermined direction.

In an exemplary embodiment, the display panel may include a base layer that is in contact with the protection member.

In an exemplary embodiment, the base layer may include a thermosetting resin, and the protection member may include a thermoplastic resin.

According to an exemplary embodiment of the invention, a method of fabricating a display device may include providing a preliminary display device and pressing the protection member using a heating block. The preliminary display device including a display panel and a protection member provided on a rear surface of the display panel. The display panel may include a pixel region, in which pixels are provided, and a peripheral region, in which the pixels are absent. The pressing of the protection member using the heating block may be performed to inactivate a predetermined number of pixels of the pixels, which are located in a region of the pixel region corresponding to a portion of the protection member.

In an exemplary embodiment, the protection member may include a thermoplastic resin, and the heating block may be heated to a temperature higher than a sublimation temperature of the thermoplastic resin.

In an exemplary embodiment, the portion of the protection member may be removed to define a groove, and a bump portion may be disposed on a rear surface of the protection member and adjacent to the groove, when the protection member is pressed by the heating block.

In an exemplary embodiment, the method may further include removing the bump portion, after the pressing the protection member using the heating block.

BRIEF DESCRIPTION OF THE DRAWINGS

Exemplary embodiments will be more clearly understood from the following brief description taken in conjunction with the accompanying drawings, in which:

FIG. 11A is a plan view illustrating an exemplary embodiment of a display device according to the invention.

Figure 1:
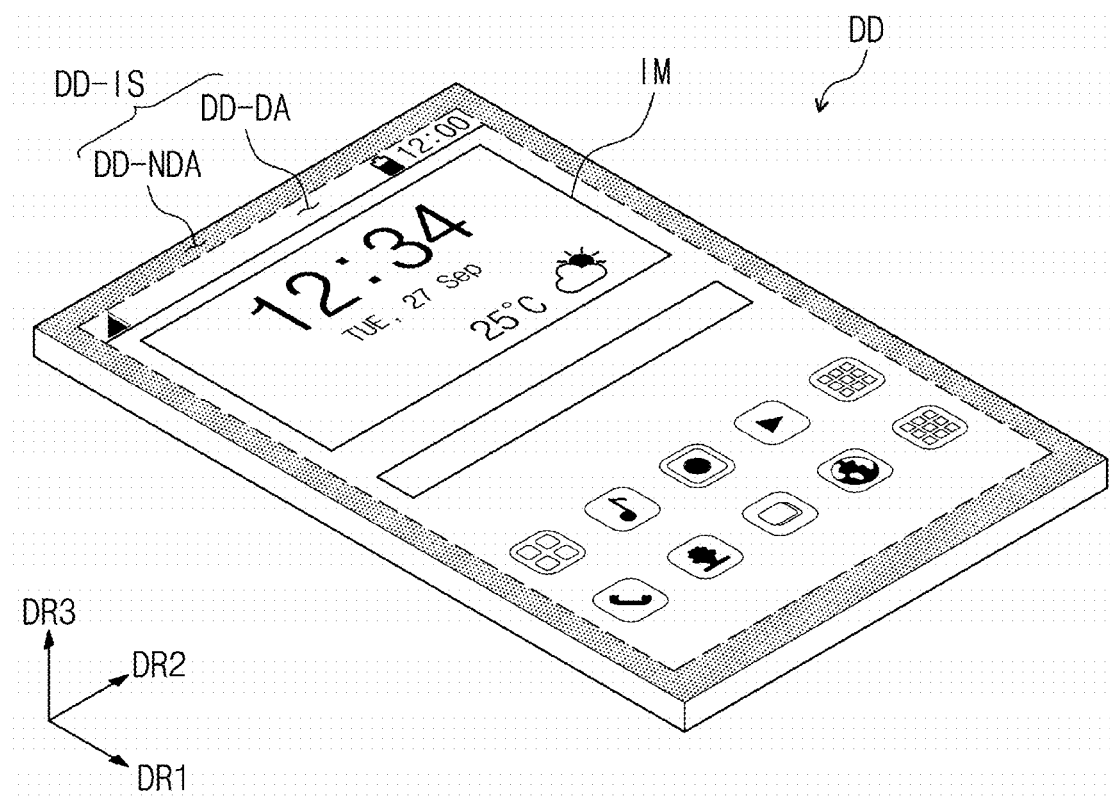
FIG. 1 is a perspective view illustrating an exemplary embodiment of a display device according to the invention.

It should be noted that these drawing figures are intended to illustrate the general characteristics of methods, structure and/or materials utilized in certain exemplary embodiments and to supplement the written description provided below. These drawings are not, however, to scale and may not precisely reflect the precise structural or performance characteristics of any given embodiment, and should not be interpreted as defining or limiting the range of values or properties encompassed by exemplary embodiments. The relative thicknesses and positioning of molecules, layers, regions and/or structural elements may be reduced or exaggerated for clarity, for example. The use of similar or identical reference numbers in the various drawings is intended to indicate the presence of a similar or identical element or feature.

DETAILED DESCRIPTION

Exemplary embodiments of the invention will now be described more fully with reference to the accompanying drawings, in which exemplary embodiments are shown. Exemplary embodiments of the invention may, however, be embodied in many different forms and should not be construed as being limited to the exemplary embodiments set forth herein; rather, these embodiments are provided so that this disclosure will be thorough and complete, and will fully convey the concept of exemplary embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the drawing figures. It will be understood that the spatially relative terms are intended to encompass different orientations of the device in use or operation in addition to the orientation depicted in the drawing figures. For example, if the device in the drawing figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

FIG. 1 is a perspective view illustrating a display device DD according to some exemplary embodiments of the invention. As shown in FIG. 1, the display device DD may include a display surface DD-IS, which is used to display an image IM. The display surface DD-IS may be defined to be parallel to a first direction axis DR1 and a second direction axis DR2. A normal direction of the display surface DD-IS (i.e., a thickness direction of the display device DD) will be referred to as a third direction axis DR3.

When a display direction of an image is set to be the third direction axis DR3, the third direction axis DR3 may be used to differentiate a front or top surface of each element or unit from a rear or bottom surface. Hereinafter, first to third directions may be directions indicated by the first to third direction axes DR1, DR2, and DR3, respectively, and will be identified with the same reference numbers.

In FIG. 1, the display device DD is illustrated to have a flat display surface, but the invention is not limited thereto. The display surface of the display device DD may have a curved or three-dimensional ("3D") shape. In the case where the display device DD has the 3D display surface, the display surface may include a plurality of display regions that are oriented in different directions. In an exemplary embodiment, the display device DD may have a display surface that is shaped like a polygonal pillar, for example.

In the illustrated exemplary embodiment, the display device DD may be a rigid display device. However, the invention is not limited thereto, and in another exemplary embodiment, the display device DD may be a flexible display device. In the illustrated exemplary embodiment, the display device DD, which may be used for a cellphone terminal, is exemplarily illustrated. Although not shown, a mainboard mounted (e.g., disposed) with electronic modules, a camera module, a power module, and so forth, along with the display device DD, may be provided in a bracket or case to constitute a cellphone terminal. The display device DD may be used for large-sized electronic devices (e.g., television sets and monitors) or small- or medium-sized electronic devices (e.g., tablets, car navigation systems, game machines, and smart watches).

As shown in FIG. 1, the display surface DD-IS may include a display region DD-DA, which is used to display the image IM, and a non-display region DD-NDA, which is provided to be adjacent to the display region DD-DA. The non-display region DD-NDA may not be used to display an image. As an example of the image IM, icon images are shown in FIG. 1. The non-display region DD-NDA may constitute or define a bezel of an electronic device.

As shown in FIG. 1, the display region DD-DA may have a rectangular shape. The non-display region DD-NDA may be provided to surround the display region DD-DA. However, the invention is not limited to this example, and in another exemplary embodiment, shapes of the display and non-display regions DD-DA and DD-NDA may be variously changed in a complementary manner. In an exemplary embodiment, the non-display region DD-NDA may be provided in only two regions of the display surface DD-IS, which are opposite to each other in the first direction DR1, for example.

FIGS. 2A to 2G are cross-sectional views illustrating display devices DD according to some exemplary embodiments of the invention. FIGS. 2A to 2G illustrate vertical sections, each of which is taken on a plane defined by the second and third directions DR2 and DR3. In FIGS. 2A to 2G, the display devices DD are illustrated in a simplified manner in order to describe a stacking structure of a functional panel and/or functional units therein.

In some exemplary embodiments, the display device DD may include a display panel, an input-sensing unit, an anti-reflection unit, and a window unit. At least two of the display panel, the input-sensing unit, the anti-reflection unit, and the window unit may be successively provided by a successive process or may be combined with each other by an adhesive member. FIGS. 2A to 2G illustrate examples in which a pressure sensitive adhesive film PSA is used as the adhesive member. In various embodiments to be described below, the adhesive member may be a typical adhesive material or a gluing agent, but the invention is not limited thereto. In another exemplary embodiment, the anti-reflection unit and the window unit may be replaced with other units or may be omitted.

In FIGS. 2A to 2G, when a unit (e.g., the input-sensing unit, the anti-reflection unit, or the window unit) is disposed on another element by a successive process, the unit will be expressed using a term "layer". When a unit (e.g., the input-sensing unit, the anti-reflection unit, or the window unit) is combined to another element by an adhesive member, the unit will be expressed using a term "panel". The unit expressed using the term "panel" may include a base layer (e.g., a synthetic resin film, a composite film, or a glass substrate) providing a base surface, but the unit expressed using the term "layer" may not have the base layer. In other words, the unit expressed using the term "panel" may be placed on a base surface that is provided by another element or unit.

The input-sensing unit, the anti-reflection unit, and the window unit may be referred to as an input-sensing panel ISP, an anti-reflection panel RPP, and a window panel WP or to as an input-sensing layer ISL, an anti-reflection layer RPL, and a window layer WL, according to the presence or absence of the base layer.

Figure 2A:
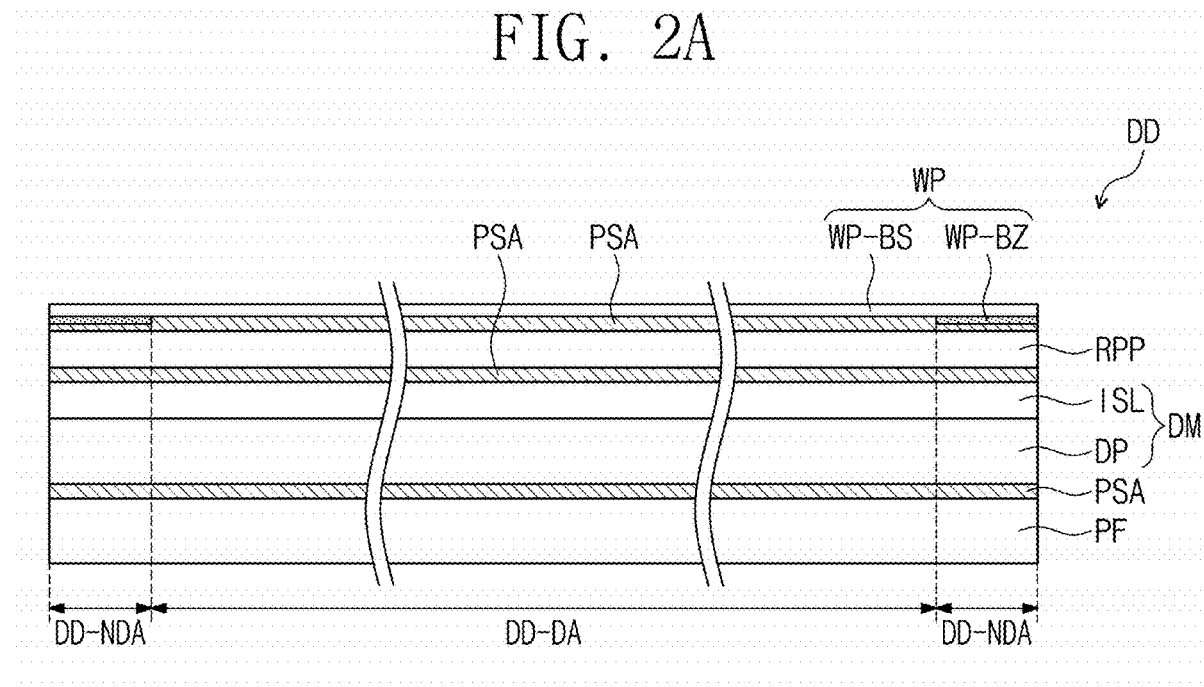
FIGS. 2A to 2G are cross-sectional views illustrating an exemplary embodiment of display devices according to the invention.

As shown in FIG. 2A, the display device DD may include a display panel DP, the input-sensing layer ISL, the anti-reflection panel RPP, the window panel WP, and a protection member PF. The input-sensing layer ISL may be directly provided on the display panel DP. In the specification, the expression "an element B1 may be directly provided on an element A1" may mean that an adhesive member is not provided between the elements A1 and B1. After the formation of the element A1, the element B1 may be disposed on a base surface, which is provided by the element A1, through a successive process.

The display panel DP and the input-sensing layer ISL, which is directly provided on the display panel DP, may be referred to as a display module DM. The pressure sensitive adhesive film PSA may be respectively provided between the display module DM and the anti-reflection panel RPP and between the anti-reflection panel RPP and the window panel WP.

The display panel DP may generate an image to be displayed to the outside, and the input-sensing layer ISL may obtain coordinate information regarding an external input (e.g., touch event). The protection member PF may support the display panel DP and protect the display panel DP from an external impact.

The protection member PF may include a plastic film serving as a base layer. In an exemplary embodiment, the protection member PF may include a plastic film including at least one of thermoplastic resins, e.g., polyethylene terephthalate ("PET"), polyethylene ("PE"), polyvinylchloride ("PVC"), polypropylene ("PP"), polystyrene ("PS"), polyacrylonitrile ("PAN"), styrene-acrylonitrile copolymer ("SAN"), acrylonitrile-butadiene-styrene ("ABS"), polymethyl methacrylate ("PMMA"), and combinations thereof. In the case where the protection member PF includes polyethylene terephthalate ("PET"), it may be excellent in heat-resistant, fatigue strength, and electric characteristics and may be insensitive to temperature and humidity.

Materials for the protection member PF are not limited to plastic resins, and organic/inorganic composites may be used for the protection member PF. The protection member PF may include a porous organic layer and an inorganic material, which is provided to fill pores of the organic layer.

According to some exemplary embodiments of the invention, the display panel DP may be a light-emitting type display panel, but the invention is not limited to a specific type of the display panel DP. In an exemplary embodiment, the display panel DP may be an organic light emitting display panel or a quantum dot light-emitting display panel, for example. A light emitting layer of the organic light emitting display panel may consist of or include an organic luminescent material. The light emitting layer of the quantum dot light-emitting display panel may include quantum dots and/or quantum rods. For the sake of simplicity, the description that follows will refer to an example in which the display panel DP is the organic light emitting display panel.

The anti-reflection panel RPP may reduce reflectance of an external light that is incident from an outer space to the window panel WP. In some exemplary embodiments, the anti-reflection panel RPP may include a phase retarder and a polarizer. In an exemplary embodiment, the phase retarder may be of a film type or a liquid crystal coating type and may include a $\lambda/2$ and/or $\lambda/4$ phase retarder, for example. The polarizer may also be of a film type or a liquid crystal coating type. The polarizer of the film type may include an elongated synthetic resin film, whereas the polarizer of the liquid crystal coating type may include liquid crystals arranged with a predetermined orientation. The phase retarder and the polarizer may further include a protection film. At least one of the phase retarder, the polarizer, or the protection films thereof may be used as a base layer of the anti-reflection panel RPP.

In some exemplary embodiments, the anti-reflection panel RPP may include color filters. The color filters may be arranged in a predetermined manner. The arrangement of the color filters may be determined in consideration of colors of lights to be emitted from pixels in the display panel DP. The anti-reflection panel RPP may further include a black matrix provided adjacent to the color filters.

In some exemplary embodiments, the anti-reflection panel RPP may include a destructive interference structure. In an exemplary embodiment, the destructive interference structure may include a first reflection layer and a second reflection layer which are provided on different layers, for example. The first reflection layer and the second reflection layer may allow a first reflection light and a second reflection light, which are respectively reflected by them, to destructively interfere with each other, and this may make it possible to reduce reflectance of the external light.

In some exemplary embodiments, the window panel WP may include a base film WP-BS and a light-blocking pattern WP-BZ. In an exemplary embodiment, the base film WP-BS may include a glass substrate and/or a synthetic resin film, for example. The base film WP-BS may not be limited to a single-layered structure. The base film WP-BS may include two or more films that are bonded to each other by an adhesive member.

The light-blocking pattern WP-BZ may be partially overlapped with the base film WP-BS. The light-blocking pattern WP-BZ may be provided on a rear surface of the base film WP-BS to define a bezel region of the display device DD (i.e., the non-display region DD-NDA of FIG. 1).

The light-blocking pattern WP-BZ may be a colored organic layer and may be provided by, for example, a coating method. Although not shown, the window panel WP may further include a functional coating layer provided on the front surface of the base film WP-BS. The functional coating layer may include an anti-fingerprint layer, an anti-reflection layer, a hard coating layer, and so forth.

Figure 2B:
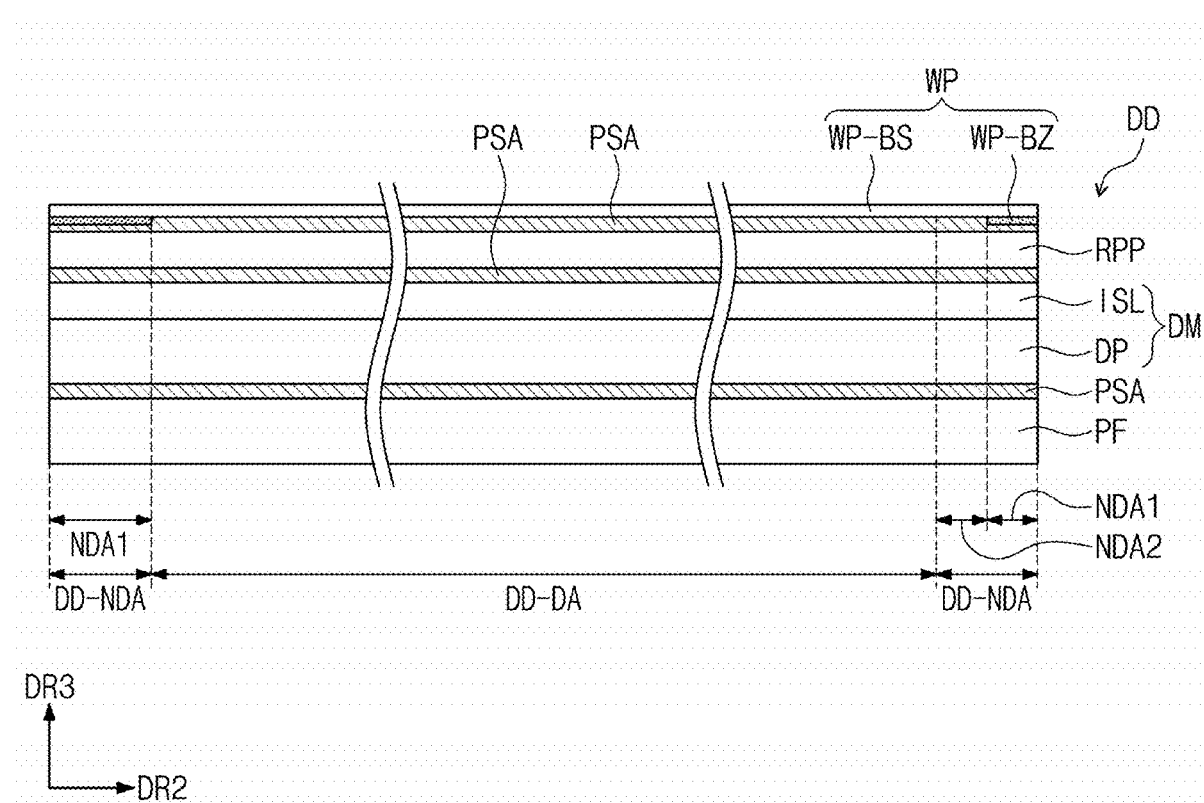

As shown in FIG. 2A, a region, on which the light-blocking pattern WP-BZ is provided, may be the same as the non-display region DD-NDA. As shown in FIG. 2B, a region, on which the light-blocking pattern WP-BZ is provided, may constitute a portion of the non-display region DD-NDA. The non-display region DD-NDA may include a first non-display region NDA1, on which the light-blocking pattern WP-BZ is provided, and a second non-display region NDA2, on which ineffective pixels PX-B (e.g., refer to FIG. 7A) are provided. The ineffective pixels PX-B will be described in more detail below. In another exemplary embodiment, although not shown, at least a portion of the light-blocking pattern WP-BZ may be overlapped with the ineffective pixels PX-B.

In FIGS. 2C to 2G, the window panel WP and the window layer WL may be illustrated in a simplified manner (e.g., without distinction of the base film WP-BS and the light-blocking pattern WP-BZ) for convenience.

Figure 2C:
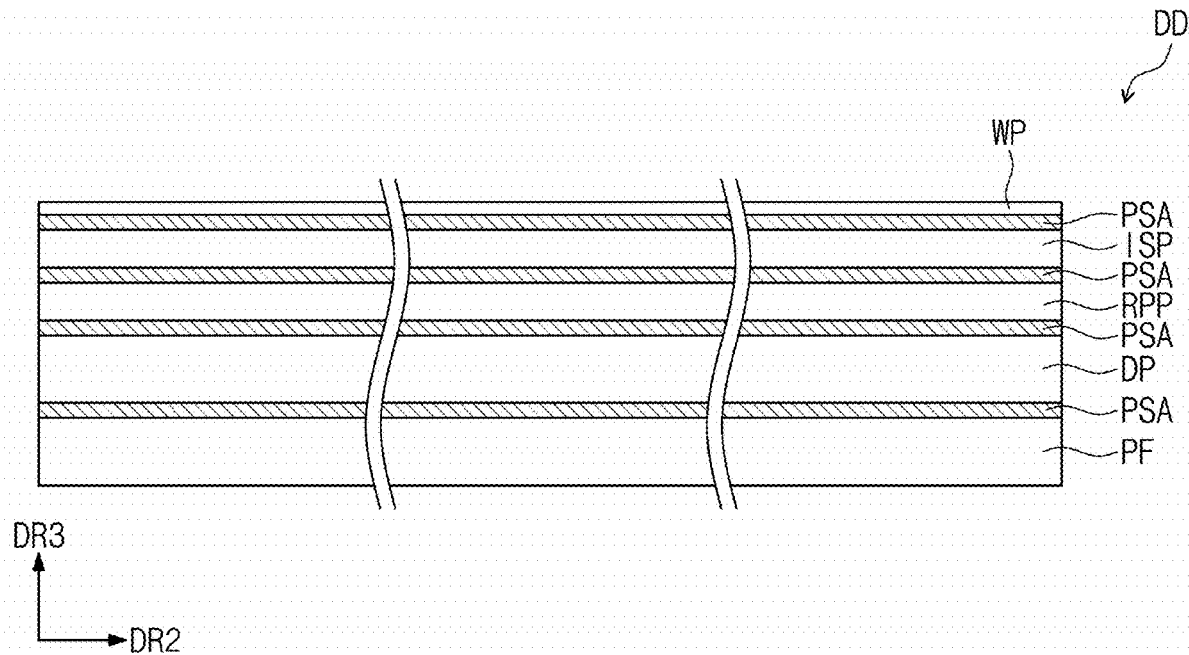
Figure 2D:
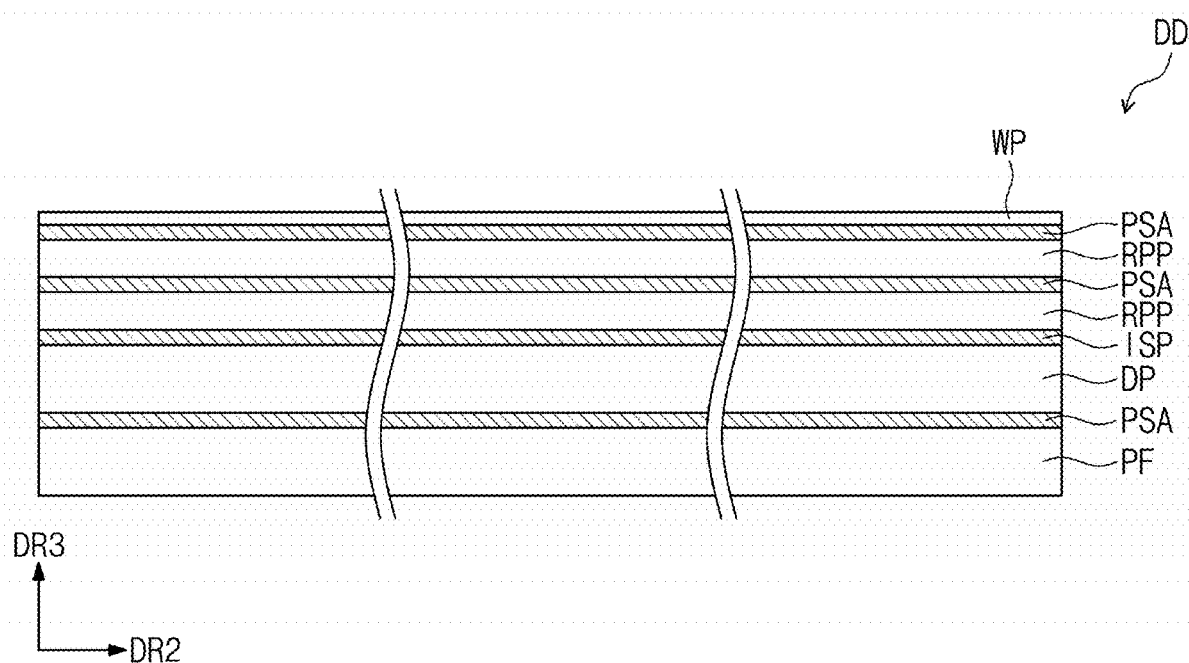

As shown in FIGS. 2C and 2D, the display device DD may include the protection member PF, the display panel DP, the input-sensing panel ISP, the anti-reflection panel RPP, and the window panel WP. In another exemplary embodiment, a stacking order of the input-sensing panel ISP and the anti-reflection panel RPP may be changed.

Figure 2E:
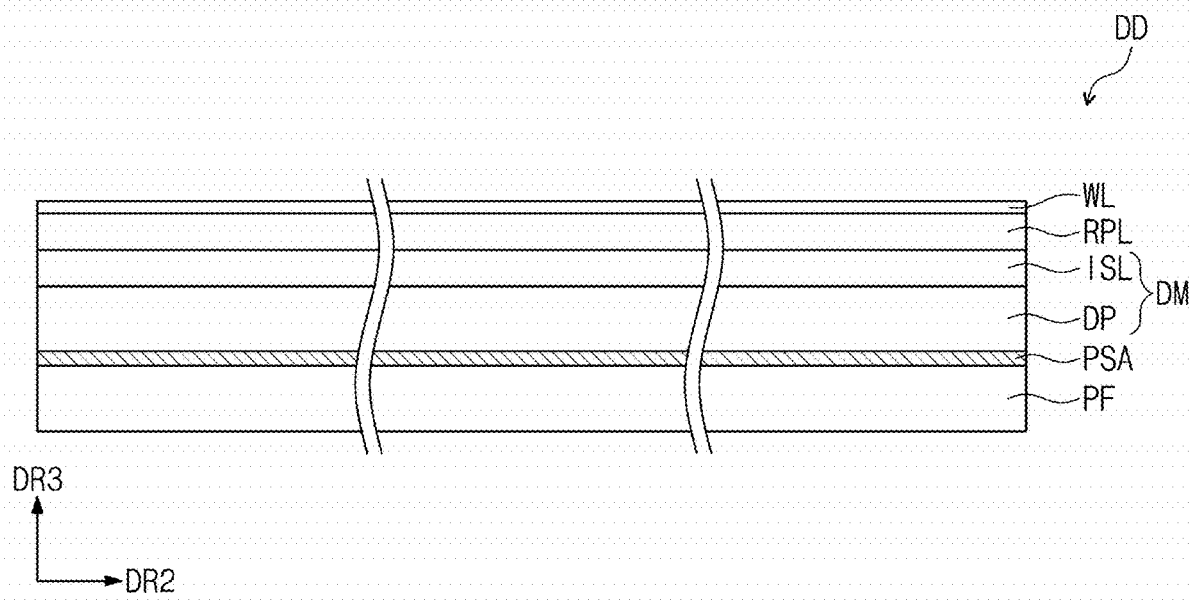

As shown in FIG. 2E, the display device DD may include the protection member PF, the display panel DP, the input-sensing layer ISL, the anti-reflection layer RPL, and the window layer WL. Adhesive members may be omitted from the display device DD, and the input-sensing layer ISL, the anti-reflection layer RPL, and the window layer WL may be disposed on a base surface, which is provided by the display panel DP, by a successive process. In another exemplary embodiment, a stacking order of the input-sensing layer ISL and the anti-reflection layer RPL may be changed.

Figure 2F:
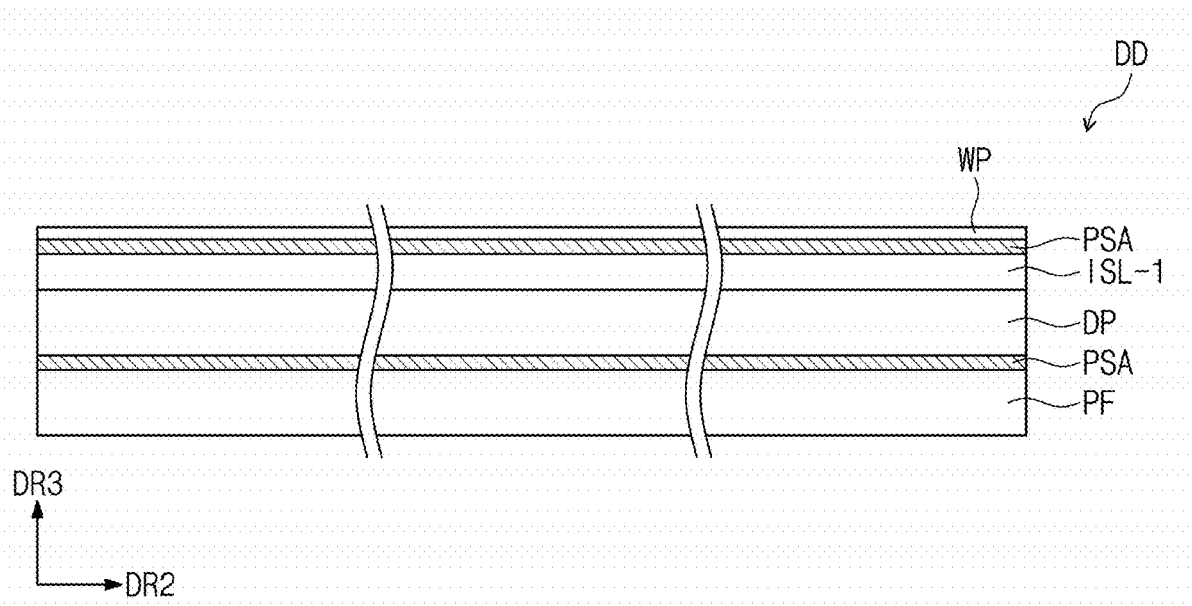
Figure 2G:
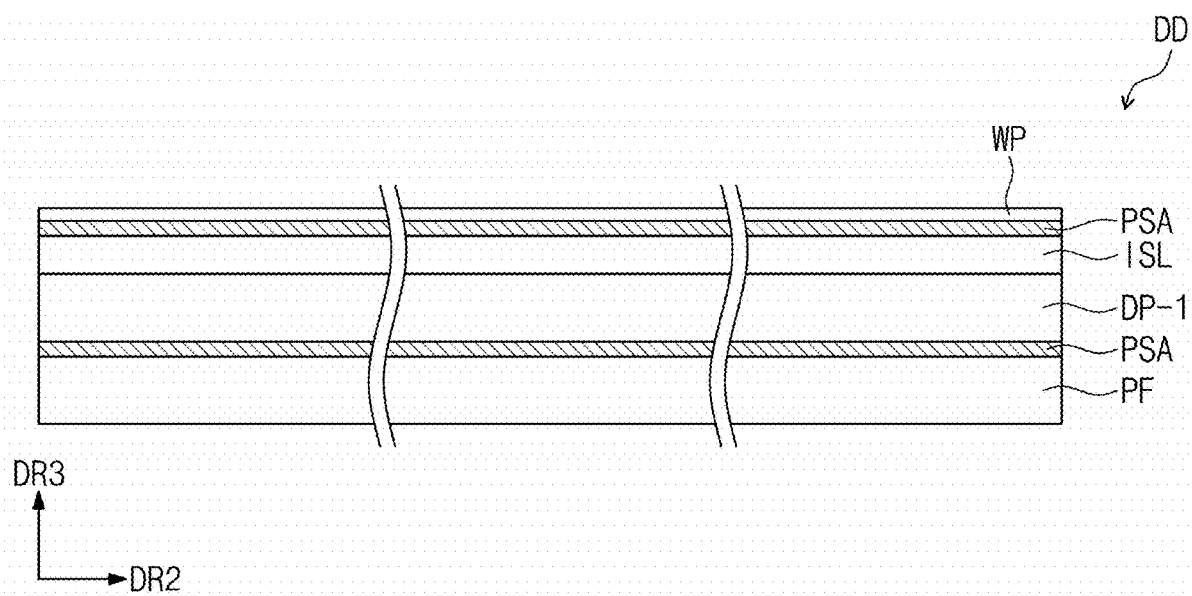

As shown in FIGS. 2F and 2G, the display device DD may not include an additional anti-reflection unit. As shown in FIG. 2F, the display device DD may include an input-sensing layer ISL-1, the protection member PF, the display panel DP, and the window panel WP. Unlike the input-sensing panel ISP or the input-sensing layer ISL shown in FIGS. 2A to 2E, the input-sensing layer ISL-1 according to the illustrated exemplary embodiment may include a color filter or a destructive interference structure that has an anti-reflection function.

As shown in FIG. 2G, the display device DD may include a display panel DP-1, the protection member PF, the input-sensing layer ISL, and the window panel WP. Unlike the display panel DP shown in FIGS. 2A to 2F, the display panel DP-1 according to the illustrated exemplary embodiment may include a color filter or a destructive interference structure that has an anti-reflection function.

Figure 3:
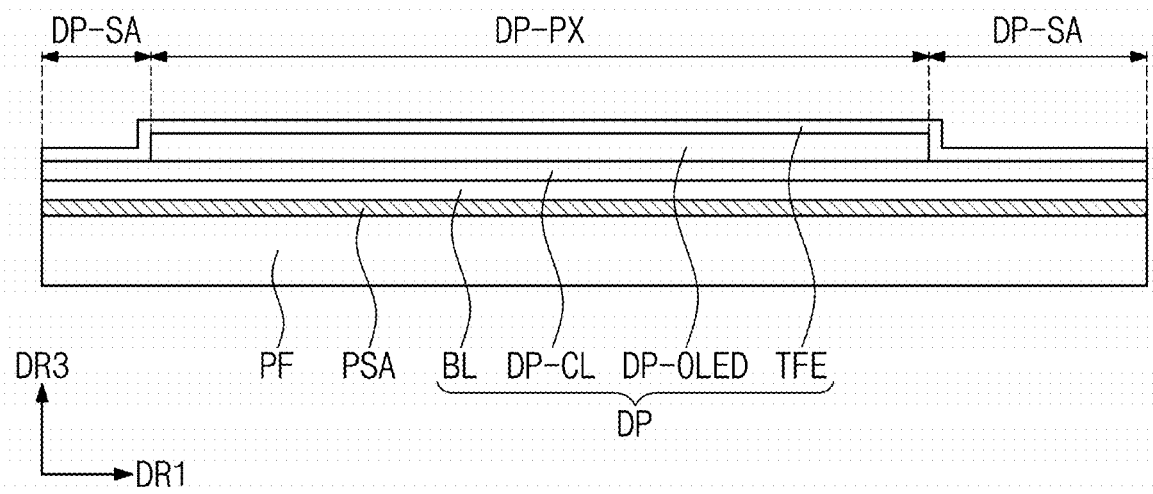
FIG. 3 is a cross-sectional view illustrating an exemplary embodiment of a display panel according to the invention.
Figure 4:
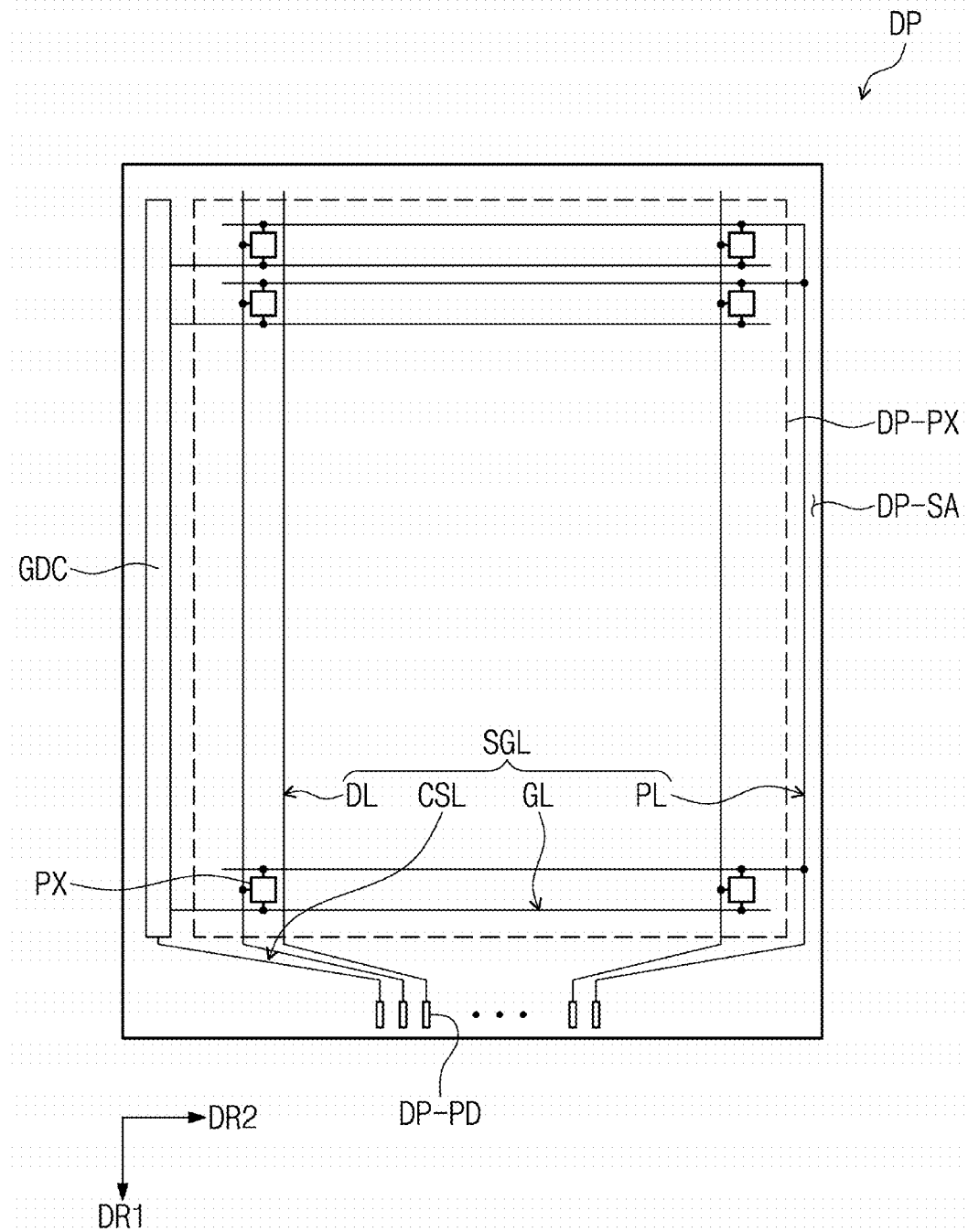
FIG. 4 is a plan view illustrating an exemplary embodiment of a display panel according to the invention.
Figure 5:
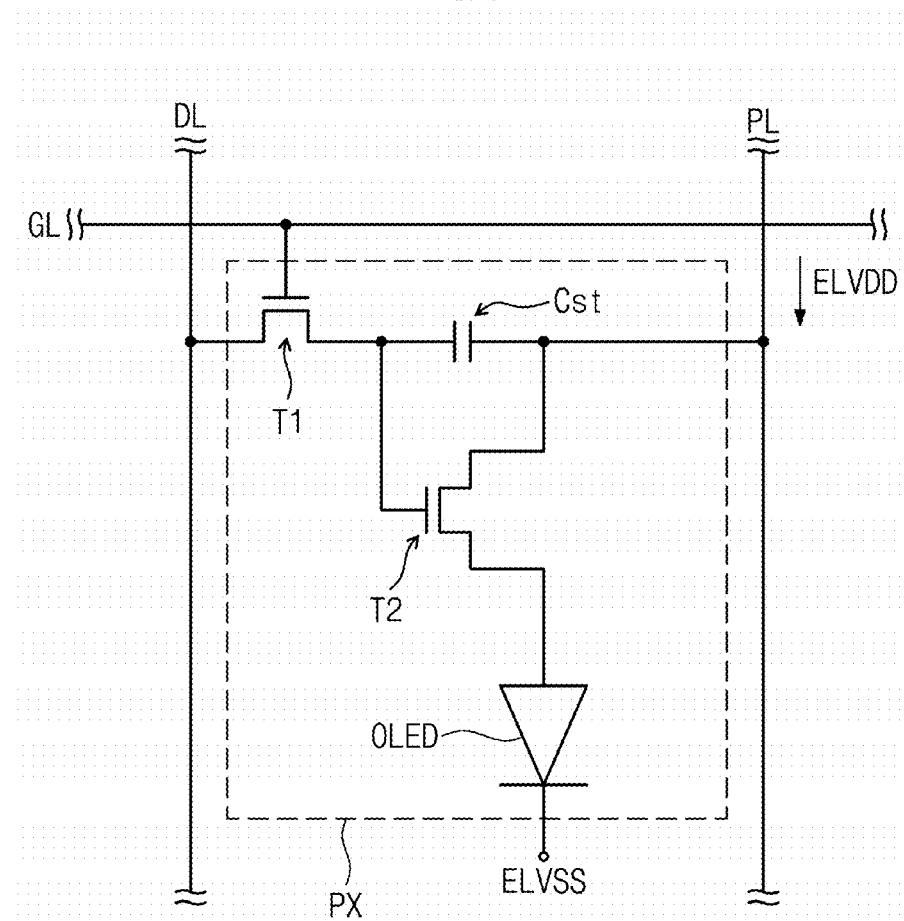
FIG. 5 is an equivalent circuit diagram illustrating an exemplary embodiment of a pixel according to the invention.
Figure 6:
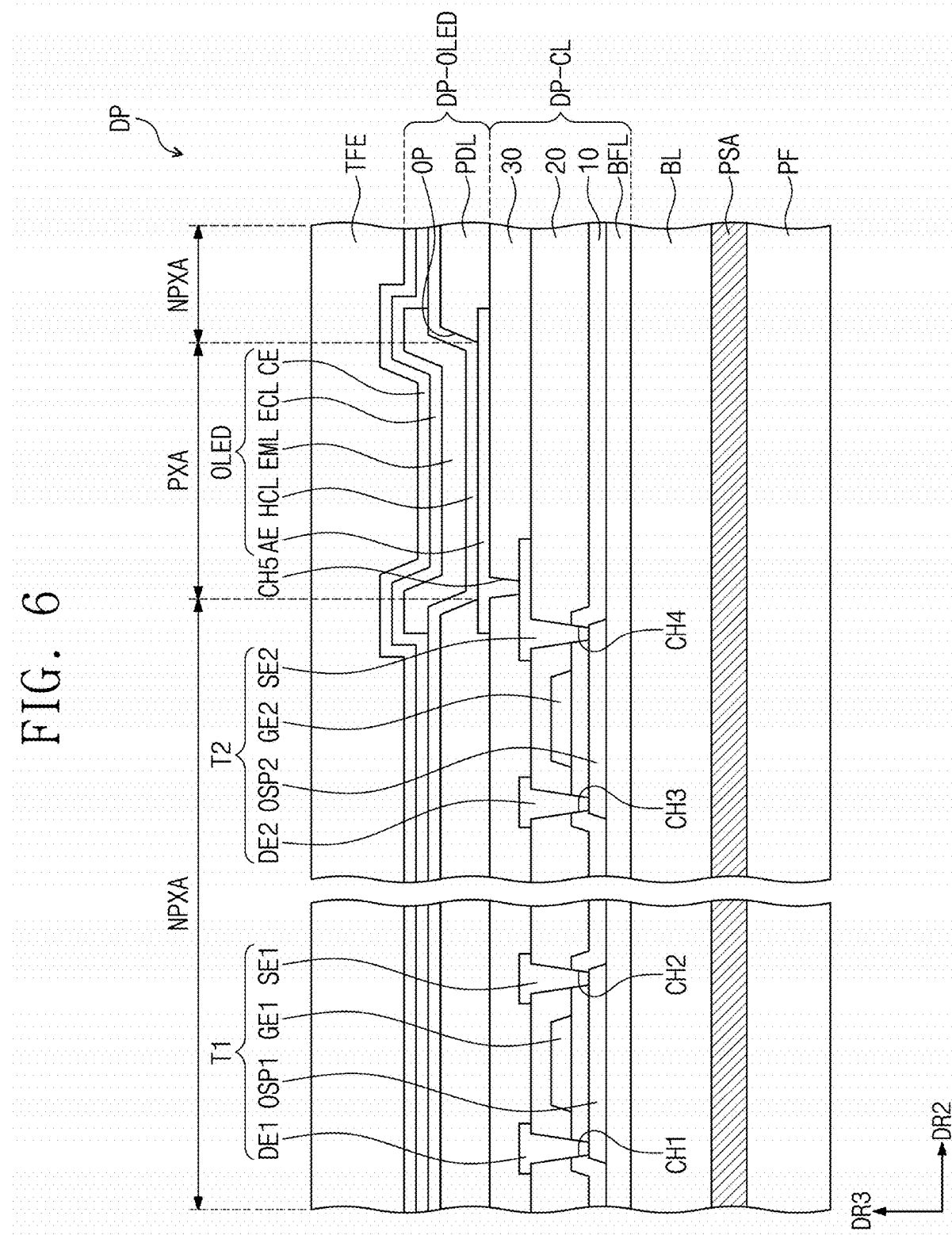
FIG. 6 is a cross-sectional view illustrating an exemplary embodiment of a display panel according to the invention.

FIG. 3 is a cross-sectional view illustrating a display panel DP according to some exemplary embodiments of the invention. FIG. 4 is a plan view illustrating a display panel DP according to some exemplary embodiments of the invention. FIG. 5 is an equivalent circuit diagram illustrating a pixel PX according to some exemplary embodiments of the invention. FIG. 6 is an enlarged cross-sectional view illustrating a display panel DP according to some exemplary embodiments of the invention. Technical features of the display panel DP to be described below may be equally applied to all of the display devices DD described with reference to FIGS. 2A to 2G. FIGS. 3 and 6 illustrate the protection member PF provided on a rear surface of the display panel DP.

As shown in FIG. 3, the display panel DP may include a base layer BL and a circuit device layer DP-CL, a display device layer DP-OLED, and a thin-film encapsulation layer TFE, which are provided on the base layer BL. Although not shown, the display panel DP may further include functional layers, such as an anti-reflection layer and a refractive index controlling layer.

The base layer BL may consist of or include a synthetic resin film. The synthetic resin layer may be disposed on a working substrate, which is used to fabricate the display panel DP. Thereafter, a conductive layer, an insulating layer, and so forth may be disposed on the synthetic resin layer. When the working substrate is removed, the synthetic resin layer may be used as the base layer BL. In an exemplary embodiment, the synthetic resin layer may include a thermosetting resin, for example. In an exemplary embodiment, the synthetic resin layer may be a polyimide-based resin layer, for example, and the invention is not limited to a specific material to be used for the base layer BL. In an exemplary embodiment, the base layer BL may include a glass substrate, a metal substrate, or an organic/inorganic composite substrate, for example.

The circuit device layer DP-CL may include at least one insulating layer and at least one circuit device. Hereinafter, an insulating layer in the circuit device layer DP-CL will be referred to as an intermediate insulating layer. The intermediate insulating layer may include at least one intermediate inorganic layer and/or at least one intermediate organic layer. The circuit device may include signal lines, pixel driving circuits, and so forth. The formation of the circuit device layer DP-CL may include forming an insulating layer, a semiconductor layer, and a conductive layer using a coating or deposition process and patterning the insulating layer, the semiconductor layer, and the conductive layer using a photolithography and etching process.

The display device layer DP-OLED may include a light-emitting device. The display device layer DP-OLED may include a plurality of organic light emitting diodes. In an exemplary embodiment, the display device layer DP-OLED may further include an organic layer, such as a pixel definition layer.

The thin-film encapsulation layer TFE may be provided to hermetically seal the display device layer DP-OLED. The thin-film encapsulation layer TFE may include at least one insulating layer. In some exemplary embodiments, the thin-film encapsulation layer TFE may include at least one inorganic layer (hereinafter, an inorganic encapsulation layer). In some exemplary embodiments, the thin-film encapsulation layer TFE may include at least one organic layer (hereinafter, an organic encapsulation layer) and at least one inorganic encapsulation layer.

The inorganic encapsulation layer may be used to protect the display device layer DP-OLED from moisture or oxygen, and the organic encapsulation layer may be used to protect the display device layer DP-OLED from a contamination material such as dust particles. In an exemplary embodiment, the inorganic encapsulation layer may include at least one of a silicon nitride layer, a silicon oxynitride layer, a silicon oxide layer, a titanium oxide layer, or an aluminum oxide layer, for example, but the invention is not limited thereto. In an exemplary embodiment, the organic encapsulation layer may include an acrylic organic layer, for example, but the invention is not limited thereto.

As shown in FIG. 4, the display panel DP may include a driving circuit GDC, a plurality of signal lines SGL, a plurality of signal pads DP-PD, and a plurality of pixels PX. Each of the pixels PX may include an organic light emitting diode and a pixel driving circuit connected thereto. The driving circuit GDC, the signal lines SGL, the signal pads DP-PD, and the pixel driving circuit may be included in the circuit device layer DP-CL shown in FIG. 3.

The pixels PX may be classified into a plurality of groups, according to colors of the pixels. In an exemplary embodiment, the pixels PX may include red pixels, green pixels, and blue pixels, for example. In another exemplary embodiment, the pixels PX may further include white pixels. However, the invention is not limited thereto, and the pixels PX may include various other color pixels. Pixels in different groups may differ from each other in terms of materials for the organic light emitting layer or colors of the color filter. Even when pixels are included in different groups, the pixel driving circuits of the pixels may be the same.

The driving circuit GDC may include a scan driving circuit. The scan driving circuit may generate a plurality of scan signals and sequentially output the scan signals to a plurality of scan lines GL to be described below. In addition, the scan driving circuit may output other control signals to a driving circuit of the pixel PX.

The scan driving circuit may include a plurality of thin-film transistors that are provided by the same process as that for the driving circuit of the pixel PX, e.g., by a low temperature polycrystalline silicon ("LTPS") process or a low temperature polycrystalline oxide ("LTPO") process.

The signal lines SGL may include scan lines GL, data lines DL, a power line PL, and a control signal line CSL. Each of the scan lines GL may be connected to corresponding ones of the pixels PX, and each of the data lines DL may be connected to corresponding ones of the pixels PX. The power line PL may be connected to the pixels PX. The control signal line CSL may be used to provide control signals to the scan driving circuit. The signal pads DP-PD may be connected to corresponding ones of the signal lines SGL.

Although not shown in FIG. 4, a circuit board may be electrically connected to the display panel DP (refer to FIG. 3). The circuit board may be a rigid or flexible circuit board. A driving chip may be mounted (e.g., disposed) on the circuit board.

Although not shown, in another exemplary embodiment, the driving chip may be mounted (e.g., disposed) on the display panel DP. The driving chip may be connected to the data lines DL and may be connected to the signal pads DP-PD. Accordingly, the data lines DL may be electrically connected to the signal pads DP-PD through the driving chip.

The display panel DP may include a pixel region DP-PX and a peripheral region DP-SA in a plan view. The pixel region DP-PX may be a region, on which the pixels PX are provided, and the peripheral region DP-SA may be a region, on which the pixels PX are not provided. In the illustrated exemplary embodiment, the peripheral region DP-SA may be defined along an edge or circumference of the pixel region DP-PX. The pixel region DP-PX may be a region having a larger area than the display region DD-DA shown in FIG. 1, and the peripheral region DP-SA may be a region having a smaller area than the non-display region DD-NDA shown in FIG. 1.

The driving circuit GDC, the signal pads DP-PD, and some signal lines may be provided on the peripheral region DP-SA. The power line PL may be used to supply a power voltage to organic light emitting diodes of the pixels PX. The power line PL may be electrically connected to anodes of the organic light emitting diodes.

FIG. 5 illustrates a scan line GL, a data line DL, a power line PL, and a pixel PX connected thereto. The structure of the pixel PX is not limited to the example of FIG. 5 and may be variously changed.

An organic light emitting diode OLED may be a top-emission type diode or a bottom-emission type diode. The pixel PX may include a first transistor T1 (or a switching transistor), a second transistor T2 (or a driving transistor), and a capacitor Cst, which are used as parts of a pixel driving circuit for driving the organic light emitting diode OLED. A first power voltage ELVDD may be provided to the second transistor T2, and a second power voltage ELVSS may be provided to the organic light emitting diode OLED. The second power voltage ELVSS may be lower than the first power voltage ELVDD.

The first transistor T1 may output a data signal applied to the data line DL, in response to a scan signal applied to the scan line GL. The capacitor Cst may be charged to have a voltage corresponding to a data signal received from the first transistor T1. The second transistor T2 may be connected to the organic light emitting diode OLED. The second transistor T2 may be used to control a driving current flowing through the organic light emitting diode OLED, in response to an amount of electric charges stored in the capacitor Cst.

The equivalent circuit in FIG. 5 is just one of possible equivalent circuits of the pixel, and the invention is not limited thereto. The pixel PX may further include at least one transistor or at least one capacitor. In another exemplary embodiment, the organic light emitting diode OLED may be coupled to the power line PL and the second transistor T2.

FIG. 6 is a cross-sectional view illustrating a portion of the display panel DP corresponding to the equivalent circuit diagram of FIG. 5.

The circuit device layer DP-CL, the display device layer DP-OLED, and the thin-film encapsulation layer TFE may be sequentially provided on the base layer BL. In the illustrated exemplary embodiment, the circuit device layer DP-CL may include a buffer layer BFL, a first intermediate inorganic layer 10, and a second intermediate inorganic layer 20, which include inorganic materials, and an intermediate organic layer 30, which includes an organic material. The inorganic and organic materials for the circuit device layer DP-CL are not limited to specific materials, and in another exemplary embodiment, the buffer layer BFL may be selectively provided or may be omitted.

A semiconductor pattern OSP1 of the first transistor T1 (hereinafter, a first semiconductor pattern) and a semiconductor pattern OSP2 of the second transistor T2 (hereinafter, a second semiconductor pattern) may be provided on the buffer layer BFL. In an exemplary embodiment, the first semiconductor pattern OSP1 and the second semiconductor pattern OSP2 may consist of or include at least one of amorphous silicon, poly silicon, or metal oxide semiconductor materials.

The first intermediate inorganic layer 10 may be provided on the first semiconductor pattern OSP1 and the second semiconductor pattern OSP2. A control electrode GE1 of the first transistor T1 (hereinafter, a first control electrode) and a control electrode GE2 of the second transistor T2 (hereinafter, a second control electrode) may be provided on the first intermediate inorganic layer 10. The first control electrode GE1 and the second control electrode GE2 may be fabricated by the same photolithography process as that for the scan lines GL (e.g., refer to FIG. 5).

The second intermediate inorganic layer 20 may be provided on the first intermediate inorganic layer 10 to cover the first control electrode GE1 and the second control electrode GE2. An input electrode DE1 and an output electrode SE1 of the first transistor T1 (hereinafter, a first input electrode and a first output electrode) and an input electrode DE2 and an output electrode SE2 of the second transistor T2 (hereinafter, a second input electrode and a second output electrode) may be provided on the second intermediate inorganic layer 20.

The first input electrode DE1 and the first output electrode SE1 may be respectively connected to the first semiconductor pattern OSP1 through a first penetration hole CH1 and a second penetration hole CH2, which are provided to penetrate the first intermediate inorganic layer 10 and the second intermediate inorganic layer 20. The second input electrode DE2 and the second output electrode SE2 may be respectively connected to the second semiconductor pattern OSP2 through a third penetration hole CH3 and a fourth penetration hole CH4, which are provided to penetrate the first intermediate inorganic layer 10 and the second intermediate inorganic layer 20. In an exemplary embodiment, at least one of the first transistor T1 and the second transistor T2 may be provided to have a bottom gate structure, for example.

The intermediate organic layer 30 may be provided on the second intermediate inorganic layer 20 to cover the first input electrode DE1, the second input electrode DE2, the first output electrode SE1, and the second output electrode SE2. The intermediate organic layer 30 may be provided to have a flat surface (e.g., a flat top surface).

The display device layer DP-OLED may be provided on the intermediate organic layer 30. The display device layer DP-OLED may include a pixel definition layer PDL and an organic light emitting diode OLED. The pixel definition layer PDL may consist of or include an organic material. A first electrode AE may be provided on the intermediate organic layer 30. The first electrode AE may be connected to the second output electrode SE2 through a fifth through hole CH5 penetrating the intermediate organic layer 30. An opening OP may be defined in the pixel definition layer PDL. The opening OP of the pixel definition layer PDL may be provided to expose at least a portion of the first electrode AE. In another exemplary embodiment, the pixel definition layer PDL may be omitted.

The pixel PX may be placed in the pixel region DP-PX (refer to FIG. 4). The pixel region DP-PX may include a light-emitting region PXA and a non-light-emitting region NPXA adjacent to the light-emitting region PXA. The non-light-emitting region NPXA may be provided to surround the light-emitting region PXA. In the illustrated exemplary embodiments, the light-emitting region PXA may be defined to correspond to a region of the first electrode AE exposed by the opening OP.

In another exemplary embodiment, the light-emitting region PXA may be overlapped with at least one of the first and second transistors T1 and T2. The opening OP may be enlarged, and not only the first electrode AE but also a light emitting layer EML to be described below may also be enlarged.

A hole control layer HCL may be provided in common on the light-emitting region PXA and the non-light-emitting region NPXA. Although not shown, a common layer, such as the hole control layer HCL, may be provided in common in a plurality of the pixels PX (e.g., refer to FIG. 4).

The light emitting layer EML may be provided on the hole control layer HCL. The light emitting layer EML may be provided on a region corresponding to the opening OP. In other words, the light emitting layer EML may include a plurality of isolated patterns, each of which is provided for a corresponding one of the pixels PX. The light emitting layer EML may include an organic material and/or an inorganic material. The light emitting layer EML may generate a predetermined color light.

In the illustrated exemplary embodiment, the light emitting layer EML is illustrated to have a patterned structure, but in another exemplary embodiment, the light emitting layer EML may be provided in common to span a plurality of the pixels PX. Here, the light emitting layer EML may generate a white-color light, for example. Also, the light emitting layer EML may have a multi-layered structure referred to as 'tandem,' for example.

An electron control layer ECL may be provided on the light emitting layer EML. Although not shown, the electron control layer ECL may be provided in common in the plurality of pixels PX (e.g., refer to FIG. 4). A second electrode CE may be provided on the electron control layer ECL. The second electrode CE may be provided in common on a plurality of the pixels PX.

The thin-film encapsulation layer TFE may be provided on the second electrode CE. The thin-film encapsulation layer TFE may be provided in common on a plurality of the pixels PX. In the illustrated exemplary embodiment, the thin-film encapsulation layer TFE may be provided to directly cover the second electrode CE. In some exemplary embodiments, a capping layer may be provided between the thin-film encapsulation layer TFE and the second electrode CE, thereby covering the second electrode CE. Here, the thin-film encapsulation layer TFE may be provided to directly cover the capping layer.

In some exemplary embodiments, the organic light emitting diode OLED may further include a resonance structure, which may be used to control a resonance distance of light emitted from the light emitting layer EML. The resonance structure may be provided between the first electrode AE and the second electrode CE, and a thickness of the resonance structure may be determined, depending on a wavelength of light to be emitted from the light emitting layer EML.

Figure 7A:
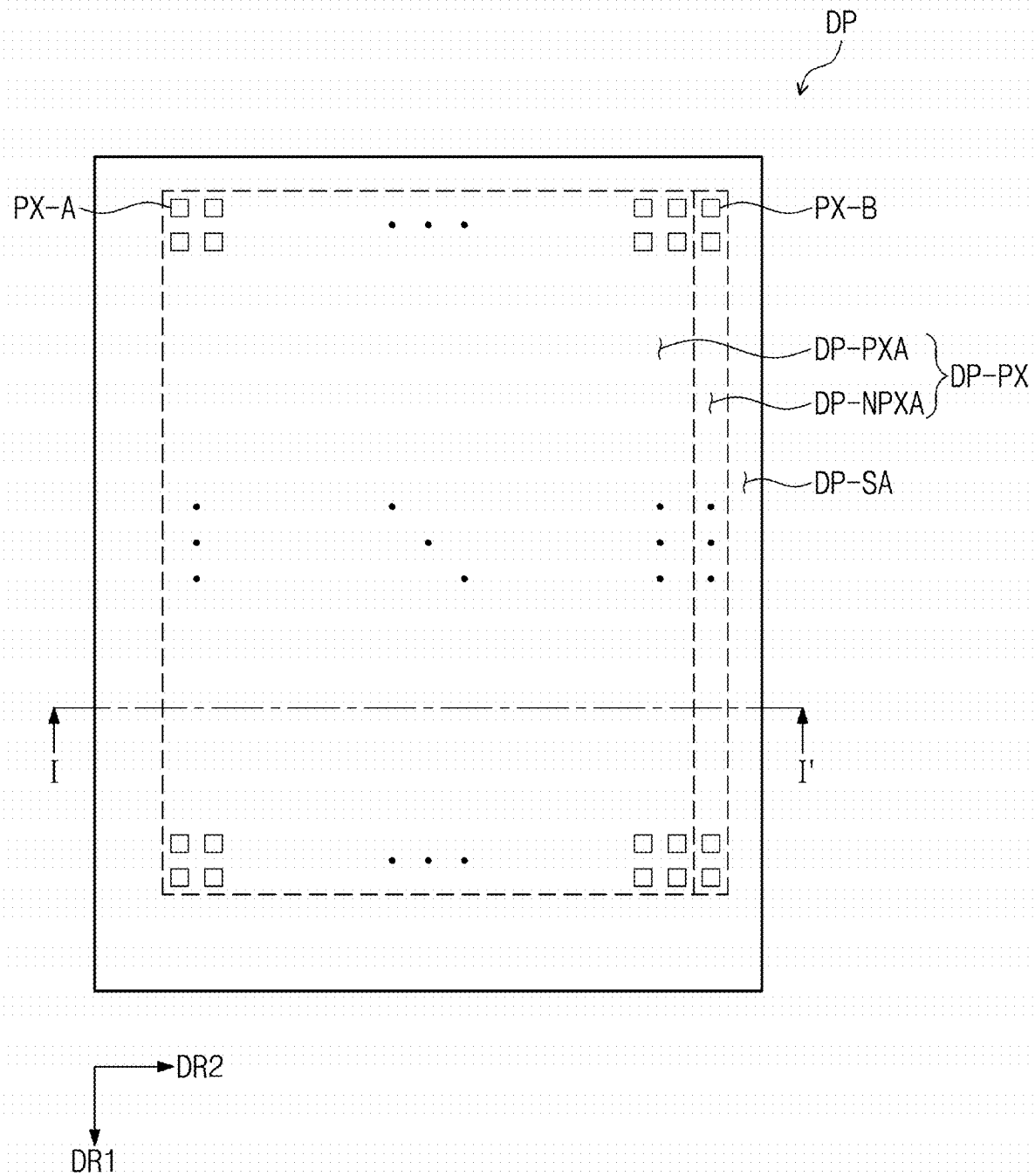
FIG. 7A is a plan view illustrating an exemplary embodiment of a display panel according to the invention.
Figure 7B:
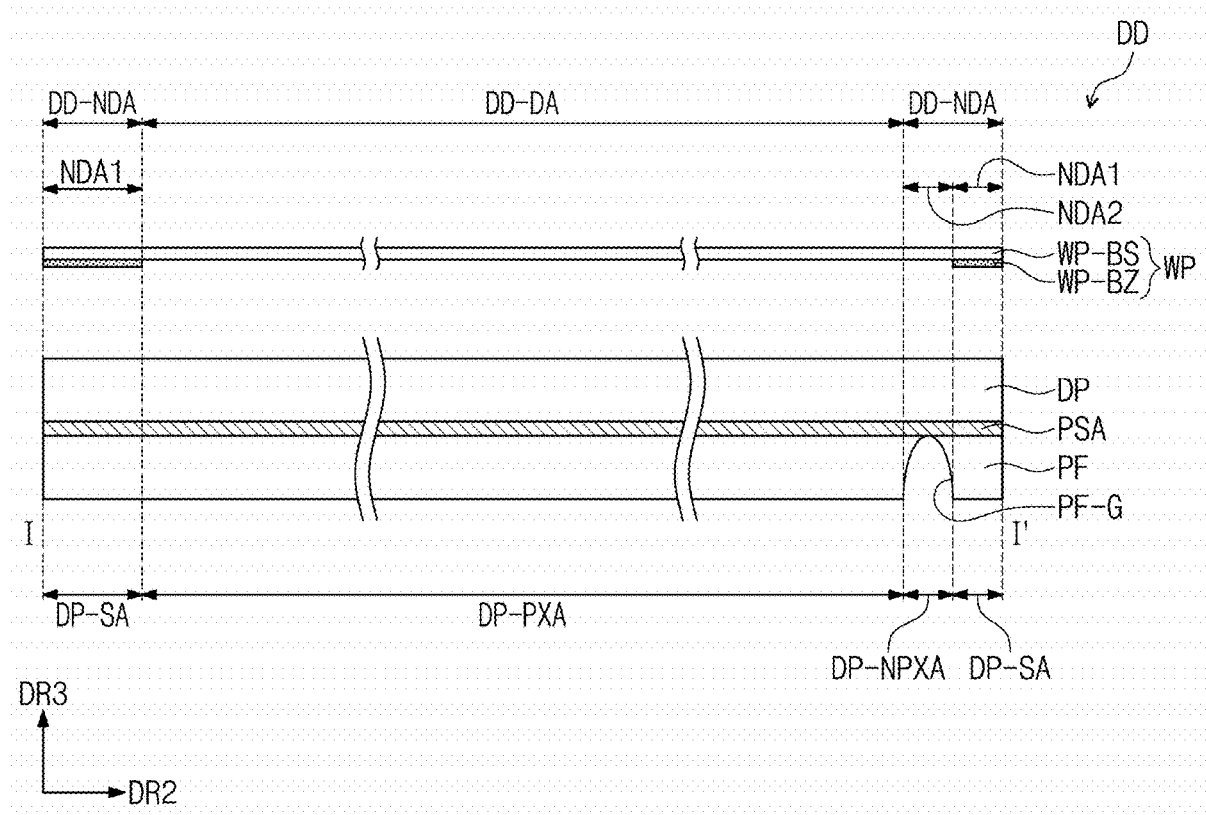
FIG. 7B is a cross-sectional view illustrating an exemplary embodiment of a display device according to the invention.
Figure 8A:
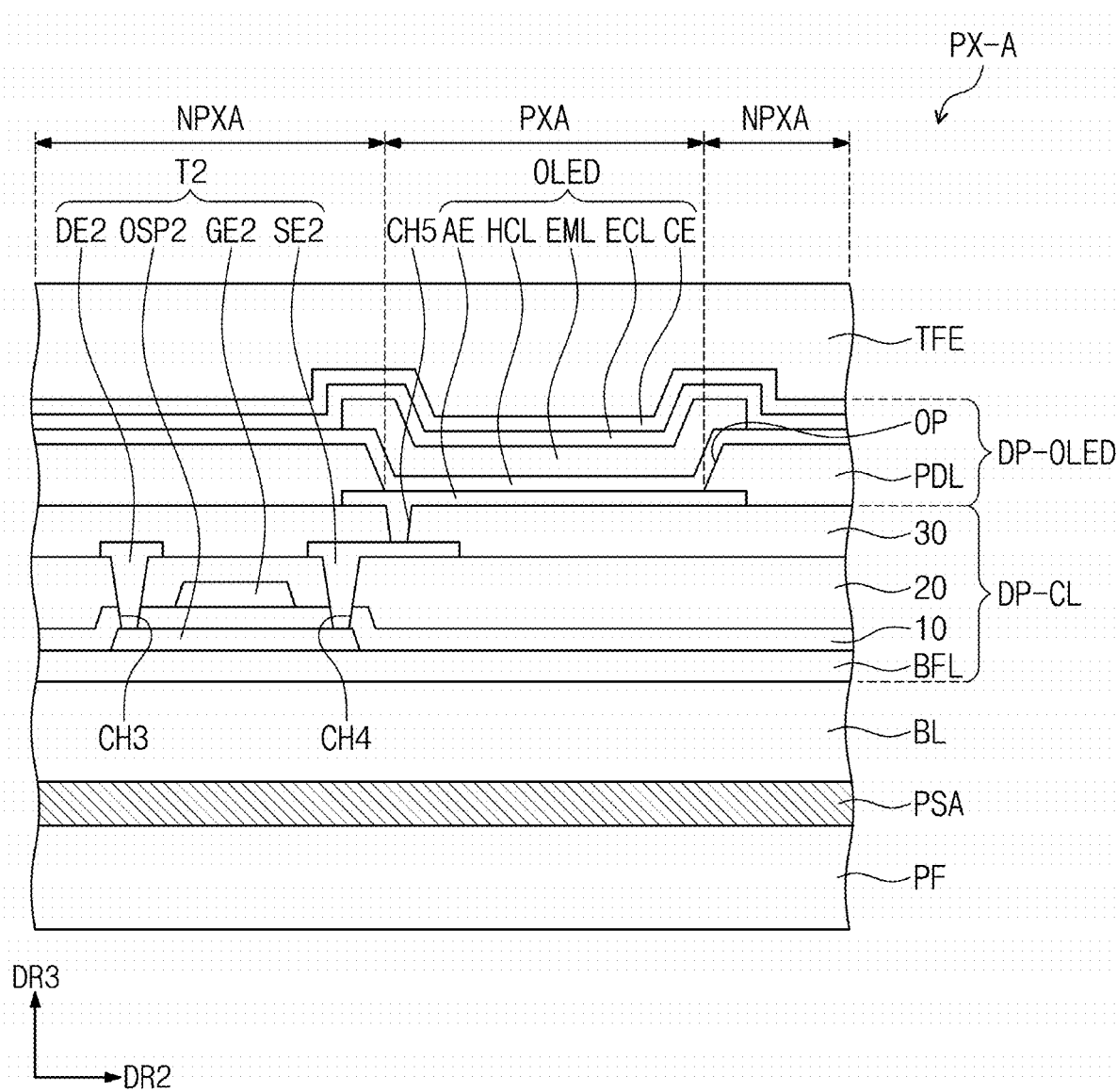
FIG. 8A is a cross-sectional view illustrating an exemplary embodiment of an effective pixel of a display panel according to the invention.
Figure 8B:
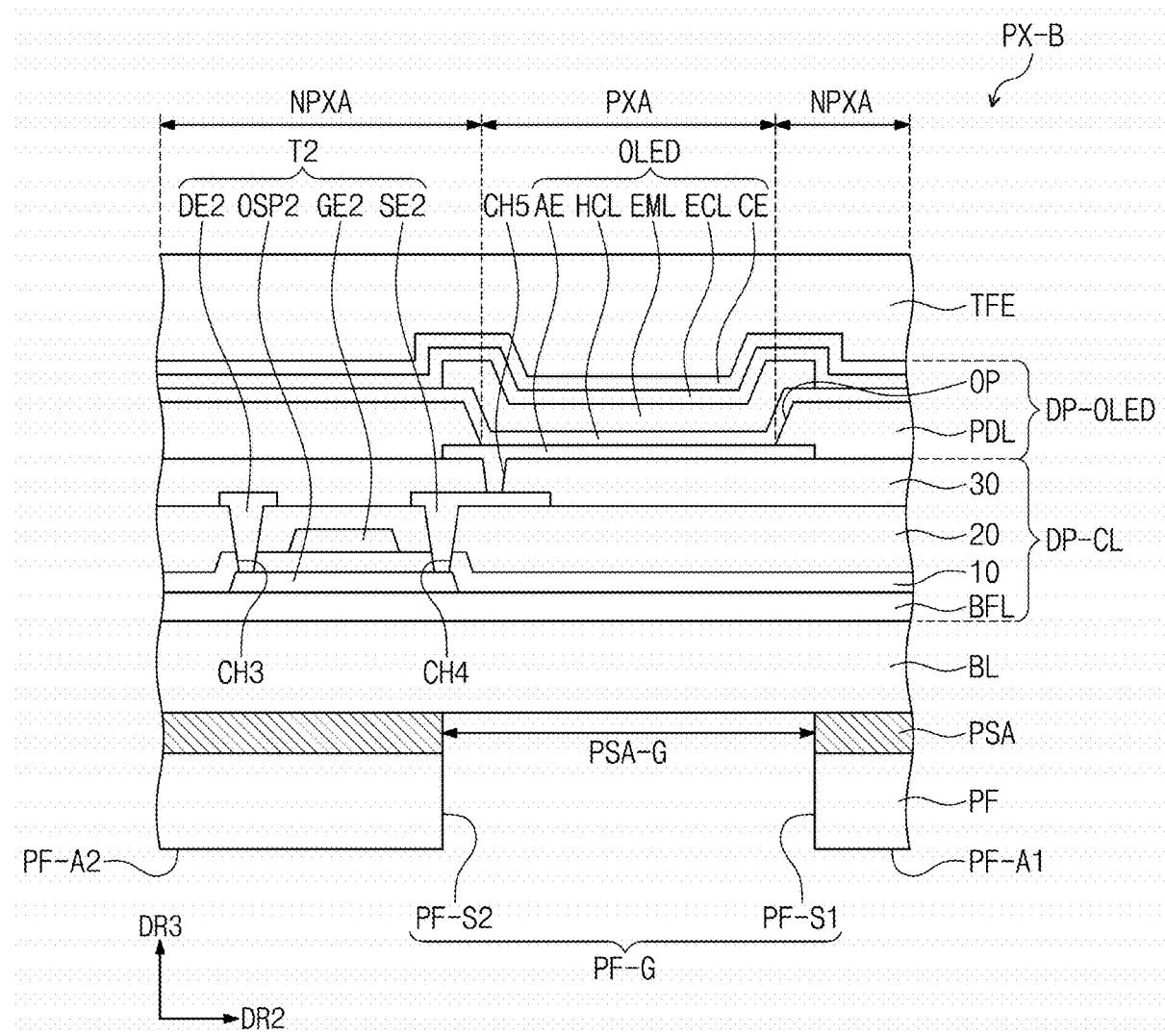
FIG. 8B is a cross-sectional view illustrating an exemplary embodiment of an ineffective pixel of a display panel according to the invention.

FIG. 7A is a plan view illustrating the display panel DP according to some exemplary embodiments of the invention. FIG. 7B is a cross-sectional view illustrating the display device DD according to some exemplary embodiments of the invention. FIG. 8A is a cross-sectional view illustrating an effective pixel PX-A of the display panel DP according to some exemplary embodiments of the invention. FIG. 8B is a cross-sectional view illustrating an ineffective pixel PX-B of the display panel DP according to some exemplary embodiments of the invention. Some of elements constituting the display device DD, except for the window panel WP, the display panel DP, and the protection member PF, may not be shown in FIG. 7B.

As shown in FIG. 7A, the display panel DP may include the pixel region DP-PX and the peripheral region DP-SA in a plan view. The pixel region DP-PX may include an effective pixel region DP-PXA provided with the effective pixels PX-A and an ineffective pixel region DP-NPXA provided with the ineffective pixels PX-B. The ineffective pixel region DP-NPXA corresponding to a single pixel column is exemplarily illustrated in FIG. 7A, but the invention is not limited thereto. In an exemplary embodiment, the ineffective pixel region DP-NPXA may correspond to a plurality of pixel columns or at least one pixel row, for example. The effective pixel region DP-PXA, the ineffective pixel region DP-NPXA, and the peripheral region DP-SA may be defined as a first region, a second region, and a third region, respectively.

Each of the effective and ineffective pixels PX-A and PX-B may include a light-emitting device and a pixel driving circuit. The effective pixel PX-A and the ineffective pixel PX-B may include pixel driving circuits having the same circuit structure. This is because pixels are designed in the same manner, without any distinction between the effective pixel PX-A and the ineffective pixel PX-B. In the case where the effective pixels PX-A include red pixels, green pixels, and blue pixels, for example, the ineffective pixels PX-B may include pixels corresponding to the red pixels, the green pixels, and the blue pixels.

The ineffective pixels PX-B may include an organic material that is denatured from an effective organic material of the effective pixels PX-A. Here, the term "effective organic material" may mean an organic luminescent material that may be used for a light-emitting device, and the term "a denatured material of the effective organic material" may mean the effective organic material in a thermally-damaged state. In an exemplary embodiment, when heat energy is provided to an organic material, effective chemical bonds of the organic material may be cut or ineffective chemical bonds may be produced in the organic material, for example. An organic material, whose effective chemical bonds are cut or in which ineffective chemical bonds are produced, may be referred to as the denatured organic material.

Thermal damage may occur in one or more organic materials of the functional layers of the organic light emitting diode OLED described with reference to FIG. 6. In an exemplary embodiment, the ineffective pixels PX-B may include a luminescent material that is denatured from an effective luminescent material of the effective pixels PX-A, for example.

In an exemplary embodiment, in the pixels PX-A and PX-B, luminescent materials for the light-emitting devices may be determined according to desired color or wavelength. Each of the effective pixels PX-A may include a corresponding one (hereinafter, an effective luminescent material) of red luminescent materials, green luminescent materials, blue luminescent materials, and white luminescent materials, for example. The ineffective pixels PX-B may include at least one of a denatured material of an effective red luminescent material, a denatured material of an effective green luminescent material, a denatured material of an effective blue luminescent material, and a denatured material of an effective white luminescent material.

The thermal damage of the effective organic material may occur during a process of defining a groove PF-G (hereinafter, a first groove). The first groove PF-G shown in FIG. 7B may be defined by a heating block (e.g., refer to FIG. 9A). The first groove PF-G may be a region, from which at least a portion of the protection member PF is removed in the thickness direction DR3. The process of defining the first groove PF-G will be described in more detail below.

The window panel WP of FIG. 2B is illustrated in FIG. 7B. The effective pixel region DP-PXA of the display panel DP may be substantially the same as the display region DD-DA of the display device DD. The ineffective pixel region DP-NPXA and the peripheral region DP-SA of the display panel DP may correspond to the non-display region DD-NDA of the display device DD.

A region, on which the light-blocking pattern WP-BZ is provided, may correspond to the peripheral region DP-SA. The ineffective pixel region DP-NPXA of the display panel DP may be overlapped with a region, in which the first groove PF-G is defined. The first groove PF-G may be overlapped with one pixel column shown in FIG. 7A and may be extended into the peripheral region DP-SA. A length of the first groove PF-G in the first direction DR1 may be substantially the same as a width of the protection member PF in the first direction DR1. The first groove PF-G may be a line-shaped or elongated region extending in a predetermined direction.

As shown in FIGS. 7A and 7B, the ineffective pixel region DP-NPXA of the display panel DP may be used to set the non-display region DD-NDA of the display device DD. By inactivating effective pixels without changing the design of the display panel DP, it may be possible to control the display region DD-DA of the display device DD.

Each of FIGS. 8A and 8B illustrates a vertical section of the display device DD corresponding to a portion of a pixel. The first groove PF-G may not be overlapped with the effective pixel PX-A and may be overlapped with the ineffective pixel PX-B.

A rear surface of the protection member PF may include a first rear region PF-A1 and a second rear region PF-A2, which are separated from each other by the first groove PF-G. The first groove PF-G may be defined by two opposite side surfaces (e.g., a first inner side surface PF-S1 and a second inner side surface PF-S2).

As shown in FIG. 8B, a second groove PSA-G corresponding to the first groove PF-G may also be defined in the pressure sensitive adhesive film PSA. The second groove PSA-G may also be provided by the heating block to be described below. A rear surface of the base layer BL corresponding to the first groove PF-G may be exposed to the outside.

In FIG. 8B, the first groove PF-G and the second groove PSA-G are illustrated to have the same width, but the invention is not limited thereto. The first groove PF-G and the second groove PSA-G may be discontinuous, and the pressure sensitive adhesive film PSA placed on the rear surface of the base layer BL may be partially exposed through the first groove PF-G.

Figure 9A:
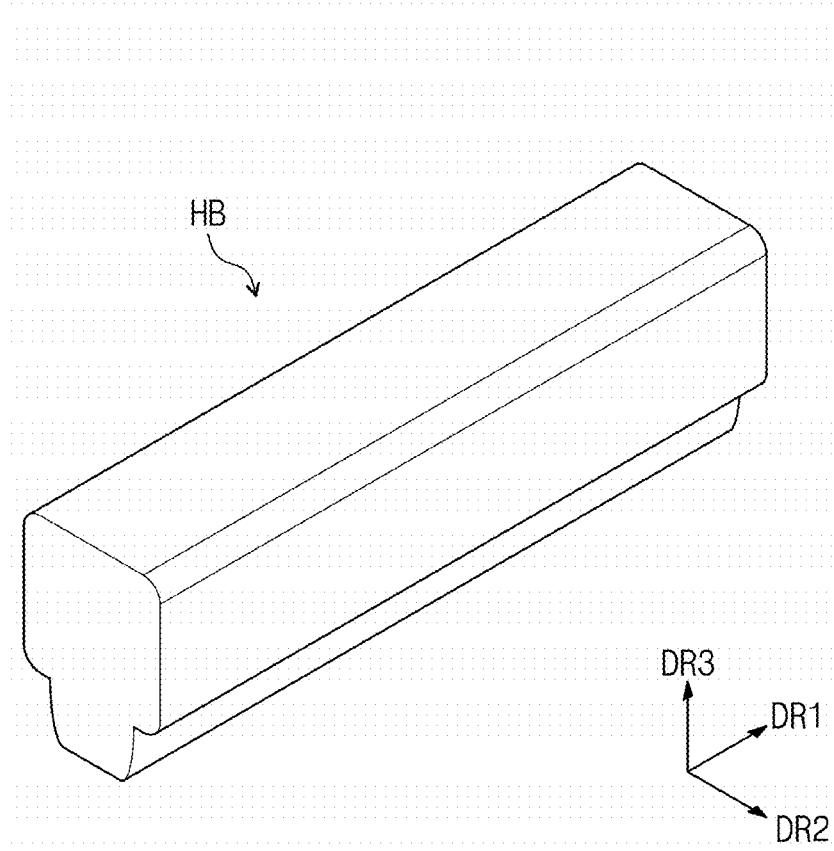
FIG. 9A is a perspective view illustrating an exemplary embodiment of a heating block according to the invention.
Figure 9B:
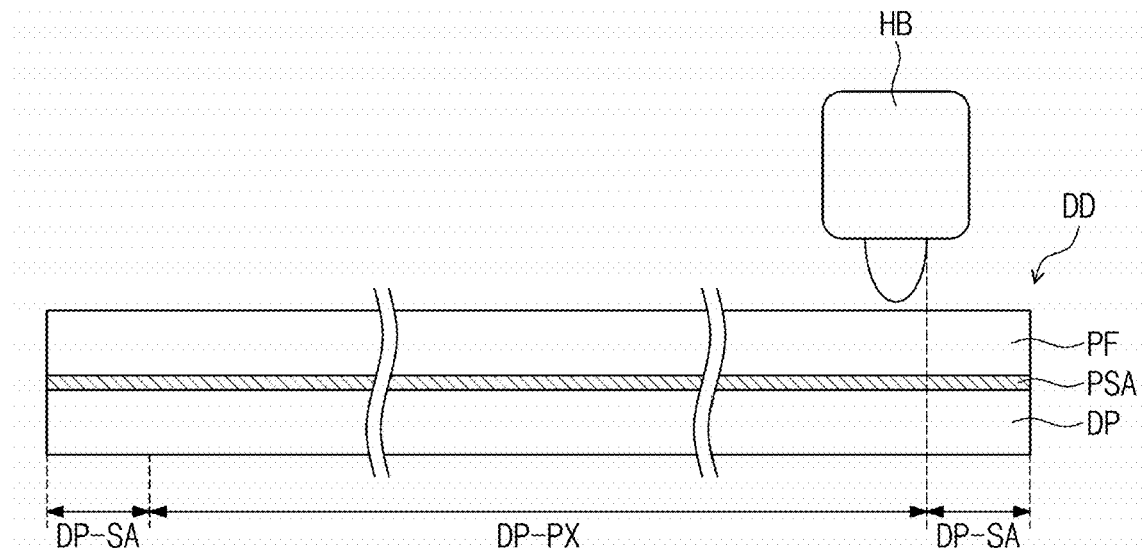
FIGS. 9B and 9C are side views illustrating an exemplary embodiment of a method of fabricating a display device, according to the invention.
Figure 9C:
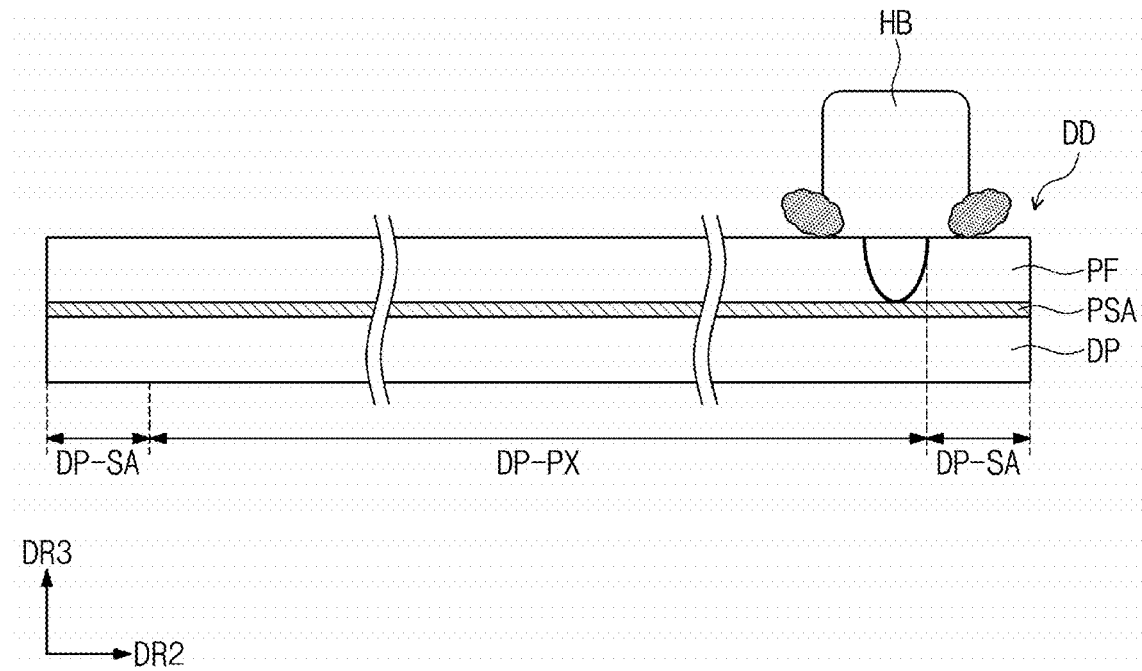
Figure 9D:
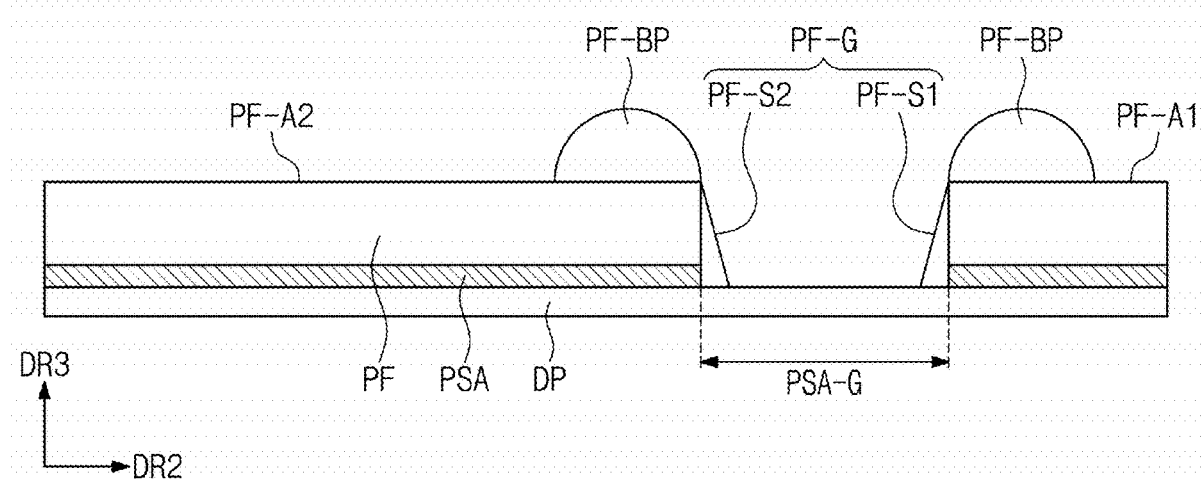
FIG. 9D is a cross-sectional view showing a display device, when a process shown in FIG. 9C is performed.

FIG. 9A is a perspective view illustrating a heating block HB according to some exemplary embodiments of the invention. FIGS. 9B and 9C are side views illustrating a method of fabricating the display device DD, some exemplary embodiments of the invention. FIG. 9D is a cross-sectional view showing the display device DD, when a process shown in FIG. 9C is performed.

The heating block HB shown in FIG. 9A may include a bar-shaped metal pillar. The heating block HB may consist of or include at least one of materials, e.g., stainless steel ("SUS"), having high strength and good durability or metallic materials (e.g., aluminum or copper) having a high thermal conductivity property. A length of the heating block HB in its extension direction (e.g., the first direction DR1) may be longer or shorter than that of the display device DD (e.g., refer to FIG. 1) in the first direction DR1.

As shown in FIG. 9B, the heating block HB may be aligned to a preliminary display device. The preliminary display device may have the same stacking structure as one of those described with reference to FIGS. 2A to 2G. However, the protection member PF may be provided to cover the entire rear surface of the display panel DP. That is, at this stage, the groove may not be provided in the protection member PF. The heating block HB may be heated to a predetermined temperature, before or after the alignment step.

As described with reference to FIGS. 4 and 7A, the display panel DP may include the pixel region DP-PX and the peripheral region DP-SA, and here, the heating block HB may be aligned to be overlapped with a portion of the pixel region DP-PX.

As shown in FIG. 9C, to remove a portion of the protection member PF, the protection member PF may be pressed by the heating block HB. The heating block HB may be heated to a temperature higher than a sublimation temperature of the protection member PF, when the heating block HB is used to press the protection member PF. In an exemplary embodiment, in the case where a PET film is used for the protection member PF, the heating block HB may be heated to a temperature higher than about 250 degrees Celsius (° C.), for example.

The maximum heating temperature of the heating block HB may be determined in consideration of physical or chemical characteristics of the base layer BL of the display panel DP. In an exemplary embodiment, the heating temperature of the heating block HB may be determined to realize the sublimation of the protection member PF without thermal damage of the base layer BL, for example. The maximum heating temperature of the heating block HB may be lower than a sublimation temperature of the base layer BL. In some exemplary embodiments, the heating temperature of the heating block HB may be lower than about 600° C., for example.

In the case where the protection member PF is pressed by the heating block HB, heat energy of the heating block HB may be transferred to pixels on a portion of the pixel region DP-PX. At a region pressed by the heating block HB, an organic material in the organic light emitting diode OLED (e.g., refer to FIG. 8B) may be denatured by the heat energy. Thus, even when the effective pixel PX-A of FIG. 8A is structurally the same as the ineffective pixel PX-B of FIG. 8B, the organic light emitting diode OLED of the ineffective pixel PX-B may not be used to emit light. That is, pixels on a portion of the pixel region DP-PX may be inactivated by the heat energy from the heating block HB.

FIG. 9D illustrates an example of the display device DD, from which the heating block HB is removed. The protection member PF may include a bump portion PF-BP, which is located adjacent to the first groove PF-G and is provided on the first rear region PF-A1 and the second rear region PF-A2. When the protection member PF is sublimated, plastic resin may be accumulated on the first rear region PF-A1 and the second rear region PF-A2 having a relatively low temperature, thereby forming the bump portion PF-BP.

Although not shown, the bump portion PF-BP may be removed by a conventional mechanical or chemical polishing method.

The first and second inner side surfaces PF-S1 and PF-S2 may be inclined at an angle to the rear surface of the display panel DP. Each of the first and second inner side surfaces PF-S1 and PF-S2 may be provided to have a linear or nonlinear slope. The profiles of the first and second inner side surfaces PF-S1 and PF-S2 may be determined by a shape of the heating block HB.

FIG. 9D illustrates an example of the pressure sensitive adhesive film PSA, in which the second groove PSA-G is defined. Here, inner side surfaces of the pressure sensitive adhesive film PSA defining the second groove PSA-G may be covered by the protection member PF. Accordingly, the inner side surfaces of the pressure sensitive adhesive film PSA may not be exposed to the outside.

A height of the first groove PF-G in the third direction DR3 may correspond to a sum of thicknesses of the pressure sensitive adhesive film PSA and the protection member PF. In an exemplary embodiment, a height of the first groove PF-G in the third direction DR3 may range from about 50 micrometers (μm) to about 100 μm, for example. In the exemplary embodiment, a height of the display panel DP in the third direction DR3 may range from about 20 μm to about 50 μm, for example. In an exemplary embodiment, a width of the first groove PF-G in the second direction DR2 may range from about 1 millimeter (mm) to about 2 mm, for example.

Figure 10A:
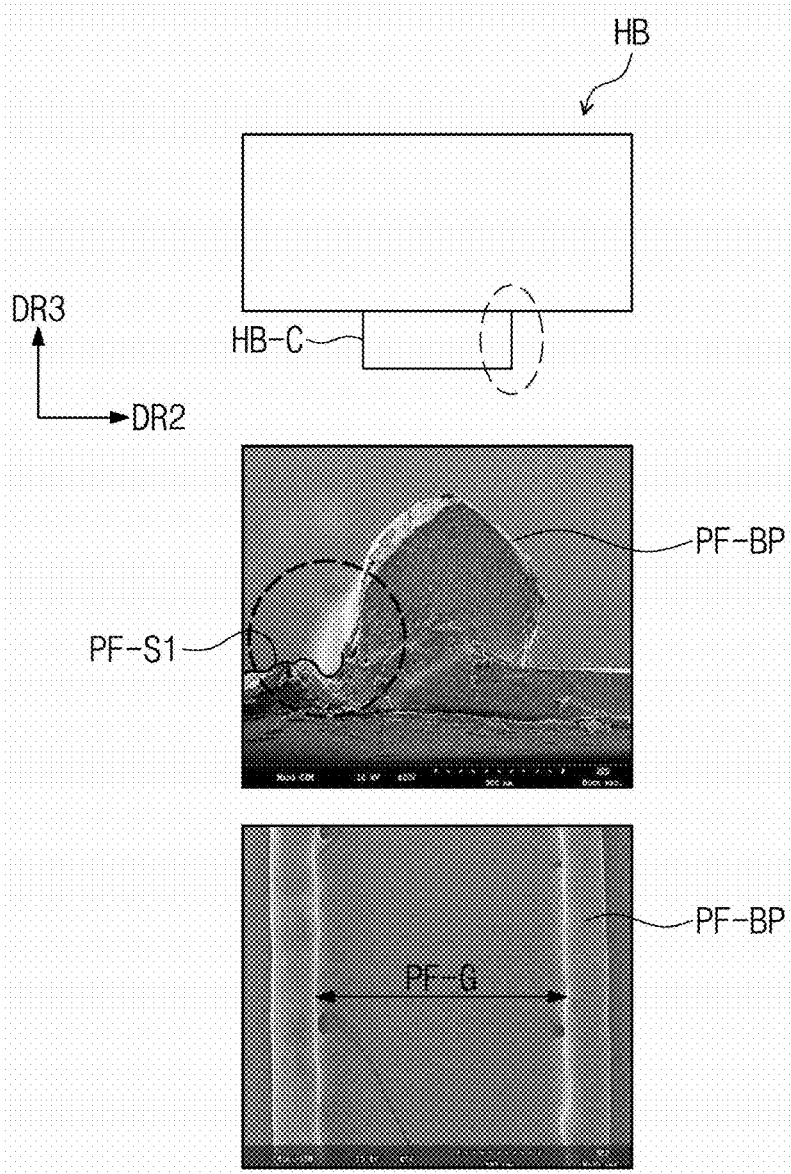
FIGS. 10A to 10C show how a shape of a bump portion of a protection member was changed according to a shape of a heating block.
Figure 10B:
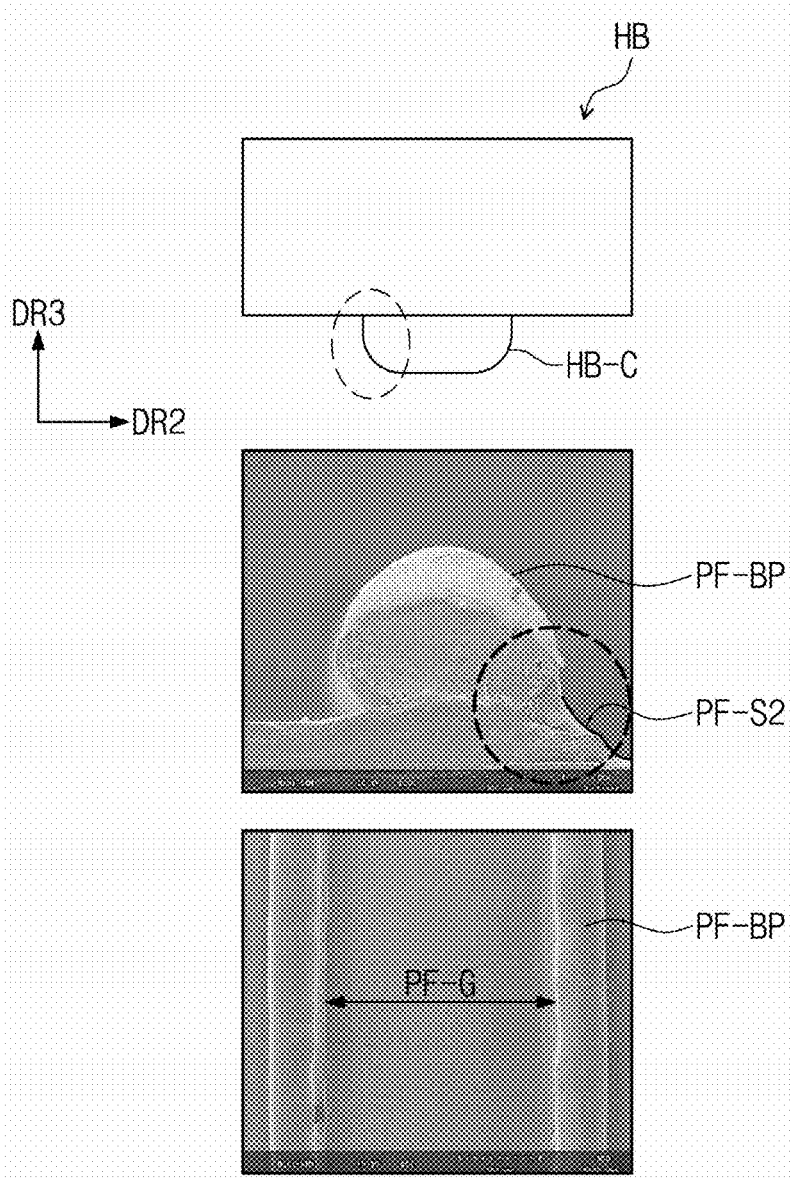
Figure 10C:
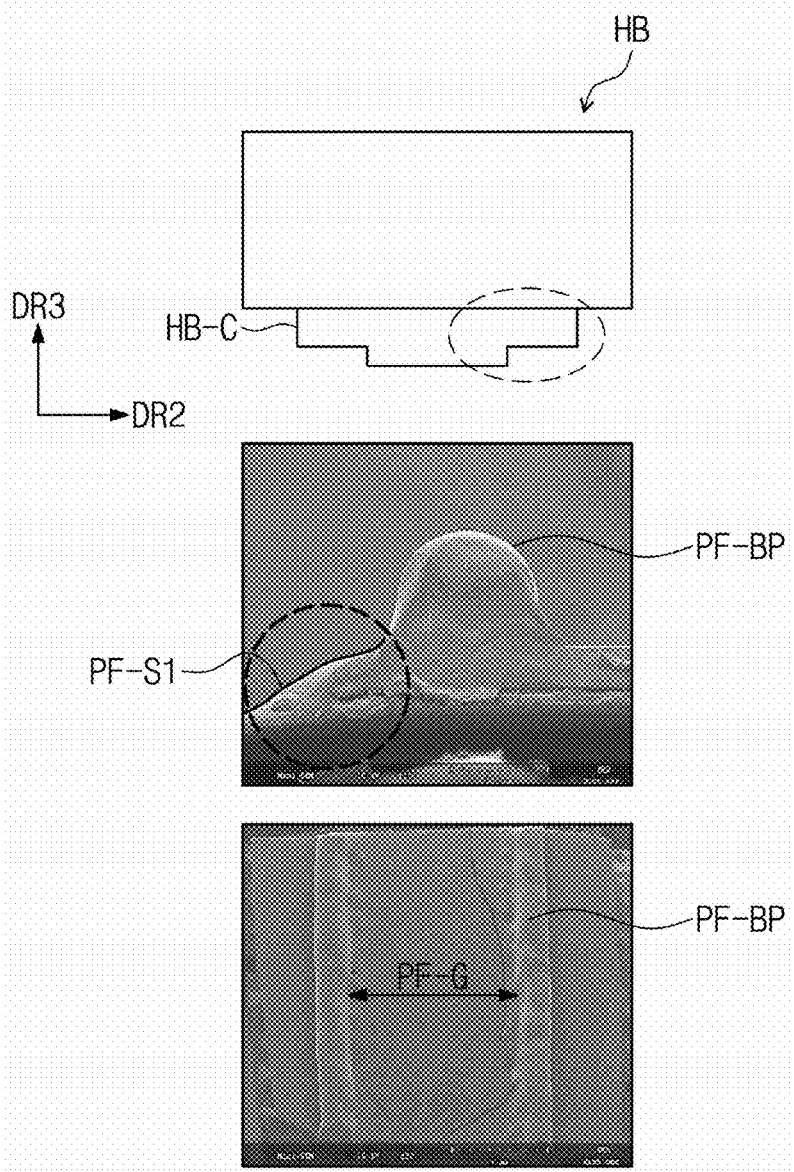
Figure 10D:
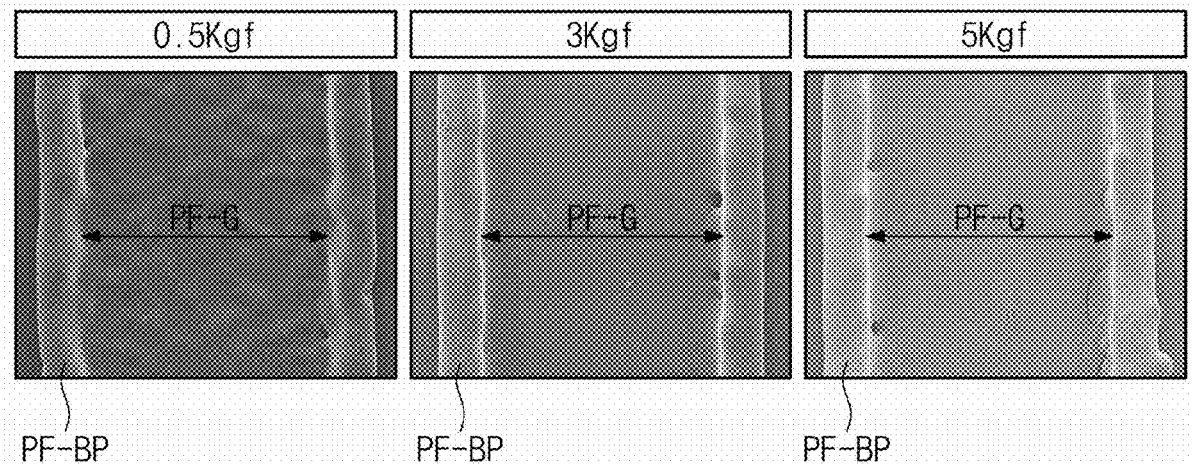
FIG. 10D shows how a shape of a groove in a protection member was changed with pressure applied to a heating block.
Figure 10E:
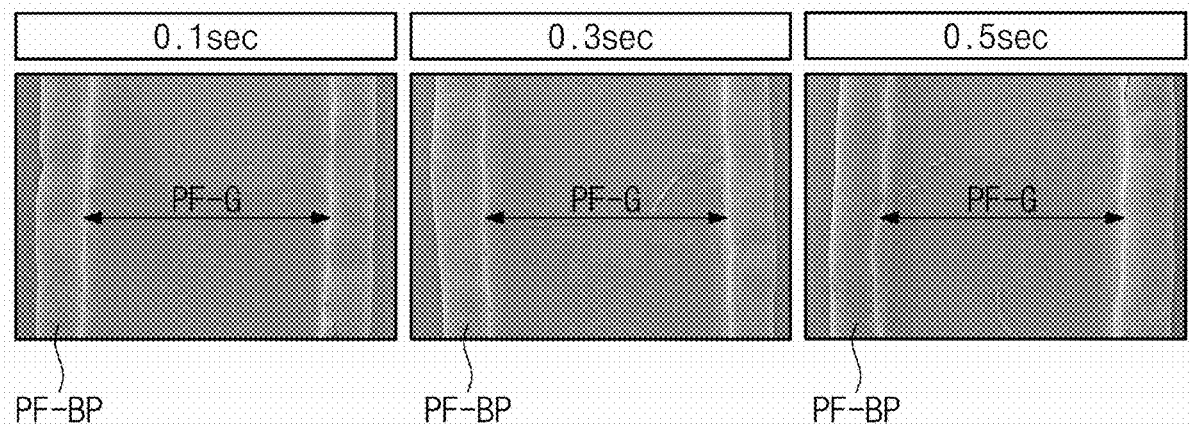
FIG. 10E shows how a shape of a groove in a protection member was changed with a contacting time of a heating block.

FIGS. 10A to 10C show how a shape of the bump portion PF-BP of the protection member PF was changed according to a shape of the heating block HB. FIG. 10D shows how a shape of the groove PF-G in the protection member PF was changed with pressure applied to the heating block HB. FIG. 10E shows how a shape of the groove PF-G in the protection member PF was changed with a contacting time of the heating block HB.

FIGS. 10A to 10C illustrate sections, which are taken along a plane defined by the second and third directions DR2 and DR3, of the heating block HB of FIG. 9A. As shown in FIGS. 10A to 10C, profiles of the first and second inner side surfaces PF-S1 and PF-S2 may be changed according to a cross-sectional shape of a contacting portion HB-C of the heating block HB.

As shown in FIG. 10A, when the contacting portion HB-C of the heating block HB has a rectangular section, the section of the first inner side surface PF-S1 may be inclined and may be provided to have a concave region. As shown in FIG. 10B, when the contacting portion HB-C of the heating block HB has a curved section, the section of the second inner side surface PF-S2 may have a curved profile. As shown in FIG. 10C, when the contacting portion HB-C of the heating block HB has a stepwise shape, the section of the first inner side surface PF-S1 may be provided to have a stepwise shape or a height difference.

As shown in FIG. 10D, in the case where the heating block HB has the same shape, roughness of a bottom surface of the groove PF-G may be changed depending on pressure exerted on the heating block HB. This may be because a removed amount of the protection member PF and the pressure sensitive adhesive film PSA is dependent on a pressure exerted on the heating block HB. In the case where the pressure exerted on the heating block HB is higher than about 3 Kilogram-force (Kgf), the roughness of the bottom surface may become substantially the same.

FIG. 10E shows images of grooves PF-G, which are provided using heating blocks having the same shape, under process conditions of different contacting times. Within a contacting time range of 0.5 second or less, the width and height of the bump portion PF-BP was measured to be substantially the same, even when the contacting time was changed.

Figure 11B:
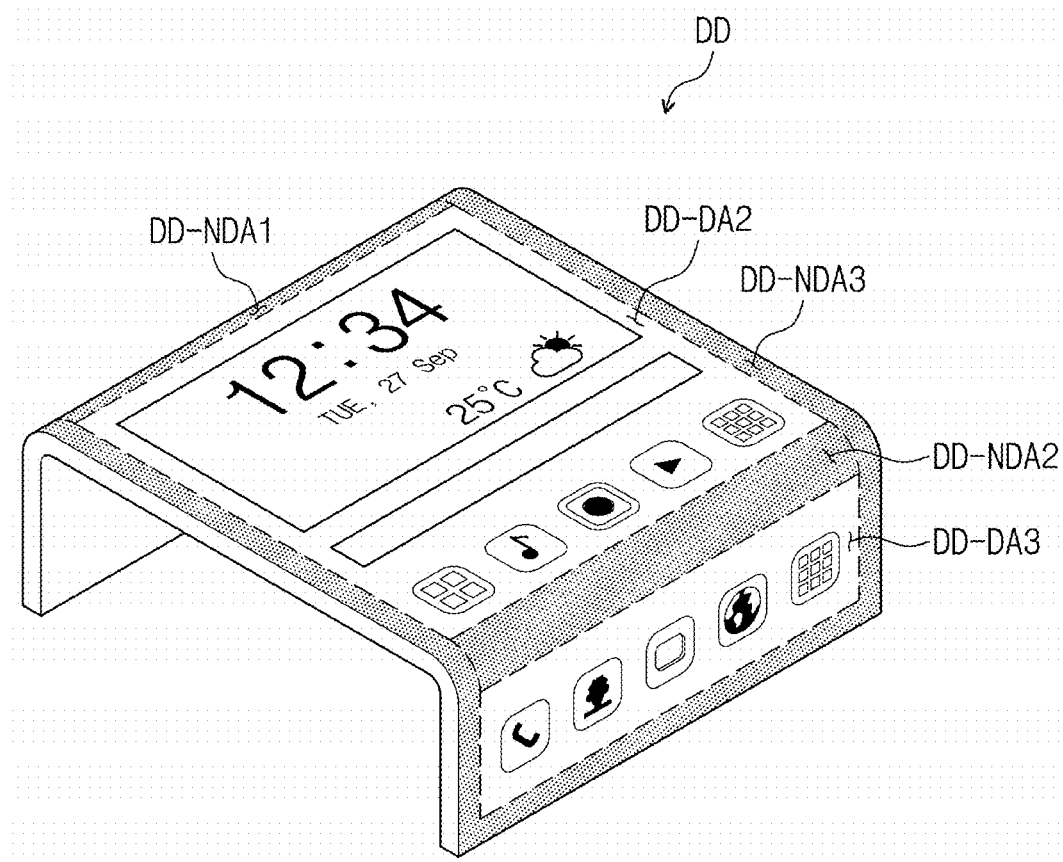
FIG. 11B is a perspective view illustrating an exemplary embodiment of a display device according to the invention.
Figure 11C:
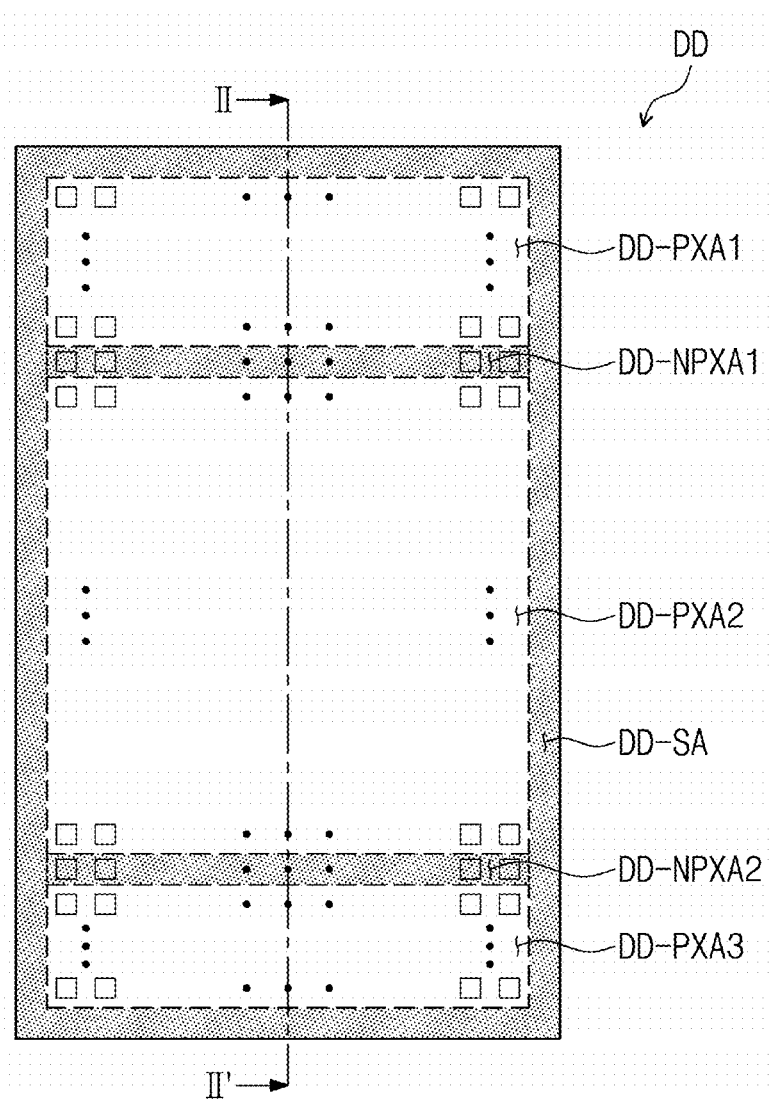
FIG. 11C is a plan view illustrating an exemplary embodiment of a display panel according to the invention.
Figure 12:
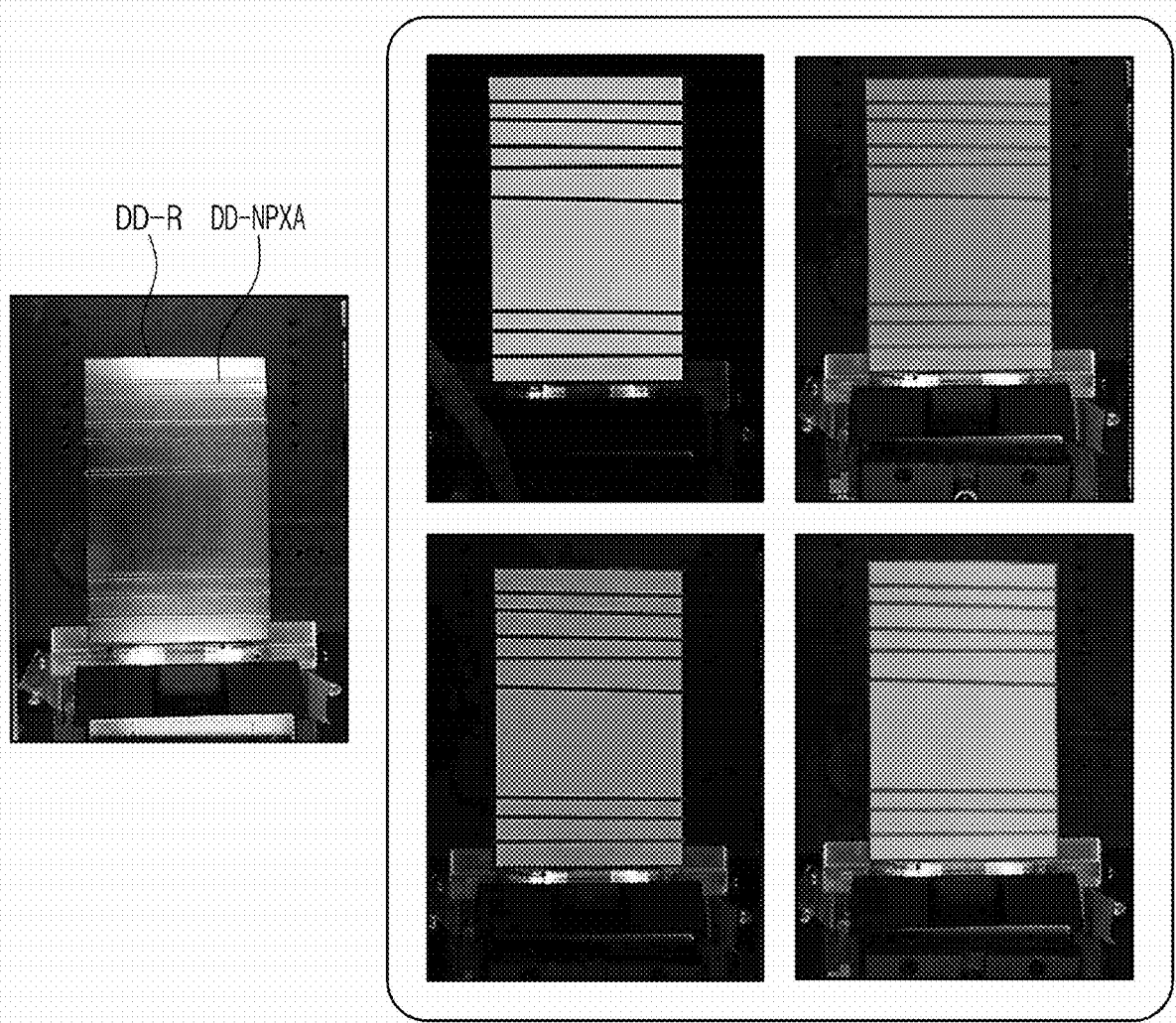
FIG. 12 shows operation states of an exemplary embodiment of a display device according to the invention.
Figure 13A:
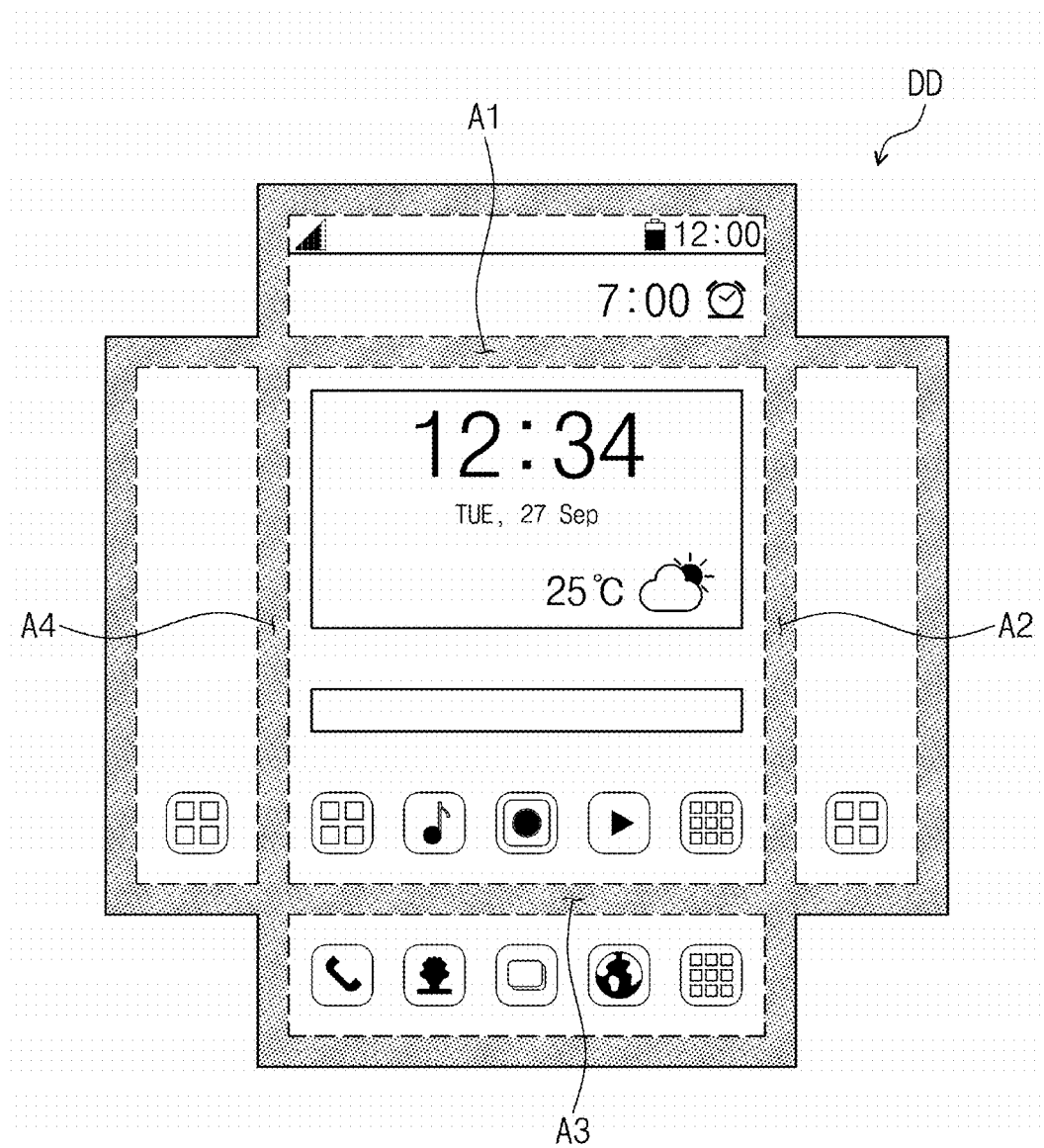
FIG. 13A is a plan view illustrating an exemplary embodiment of a display device according to the invention.
Figure 13B:
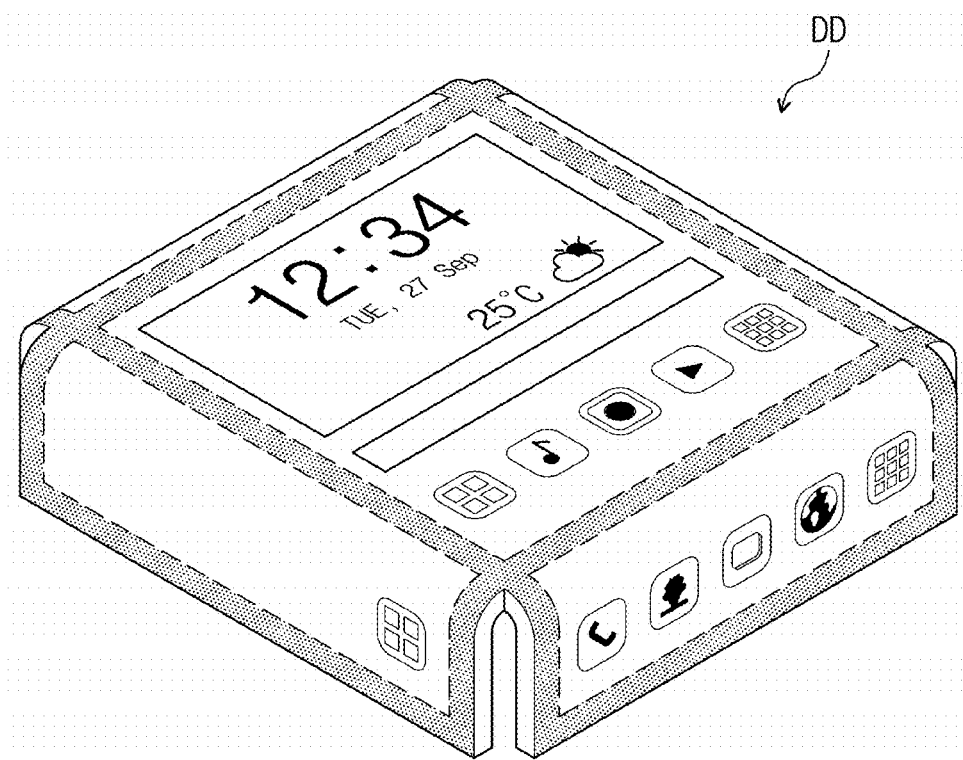
FIG. 13B is a perspective view illustrating an exemplary embodiment of a display device according to the invention.

FIG. 11A is a plan view illustrating a display device DD according to some exemplary embodiments of the invention. FIG. 11B is a perspective view illustrating a display device DD according to some exemplary embodiments of the invention. FIG. 11C is a plan view illustrating a display panel DP according to some exemplary embodiments of the invention. FIG. 12 shows operation states of a display device DD according to some exemplary embodiments of the invention. FIG. 13A is a plan view illustrating a display device DD according to some exemplary embodiments of the invention. FIG. 13B is a perspective view illustrating a display device DD according to some exemplary embodiments of the invention. For concise description, an element previously described with reference to FIGS. 1 to 10E may be identified by a similar or identical reference number without repeating an overlapping description thereof.

The display device DD according to the illustrated exemplary embodiment may be partially bent, as shown in FIGS. 11A and 11B. The display device DD may include a plurality of display regions, which are used to display an image, and a non-display region, which is not used to display the image.

The non-display region may include a first group of non-display regions, which are located between the display regions, and a second group of non-display regions, which are located outside the display regions.

In an exemplary embodiment, as shown in FIGS. 11A and 11B, the display device DD may be provided to include a first display region DD-DA1, a second display region DD-DA2, and a third display region DD-DA3, for example. The first group of the non-display regions may include a first non-display region DD-NDA1, which is provided between the first display region DD-DA1 and the second display region DD-DA2, and a second non-display region DD-NDA2, which is provided between the second display region DD-DA2 and the third display region DD-DA3. As shown in FIGS. 11A and 11B, the second group of non-display regions may include a third non-display region DD-NDA3.

As shown in FIG. 11C, the display panel DP may include a first effective pixel region DP-PXA1, a second effective pixel region DP-PXA2, and a third effective pixel region DP-PXA3, which correspond to the first display region DD-DA1, the second display region DD-DA2, and the third display region DD-DA3, respectively. The display panel DP may include a first ineffective pixel region DP-NPXA1 and a second ineffective pixel region DP-NPXA2, which correspond to the first non-display region DD-NDA1 and the second non-display region DD-NDA2, respectively. The display panel DP may include the peripheral region DP-SA corresponding to the third non-display region DD-NDA3.

The first effective pixel region DP-PXA1, the first ineffective pixel region DP-NPXA1, and the peripheral region DP-SA may be defined as a first region, a second region, and a third region, respectively. Here, the second effective pixel region DP-PXA2 may be spaced apart from the first effective pixel region DP-PXA1 with the first ineffective pixel region DP-NPXA1 interposed therebetween and may be defined as a fourth region. The second ineffective pixel region DP-NPXA2 and the third effective pixel region DP-PXA3 may be defined as a fifth region and a sixth region, respectively.

Figure 11D:
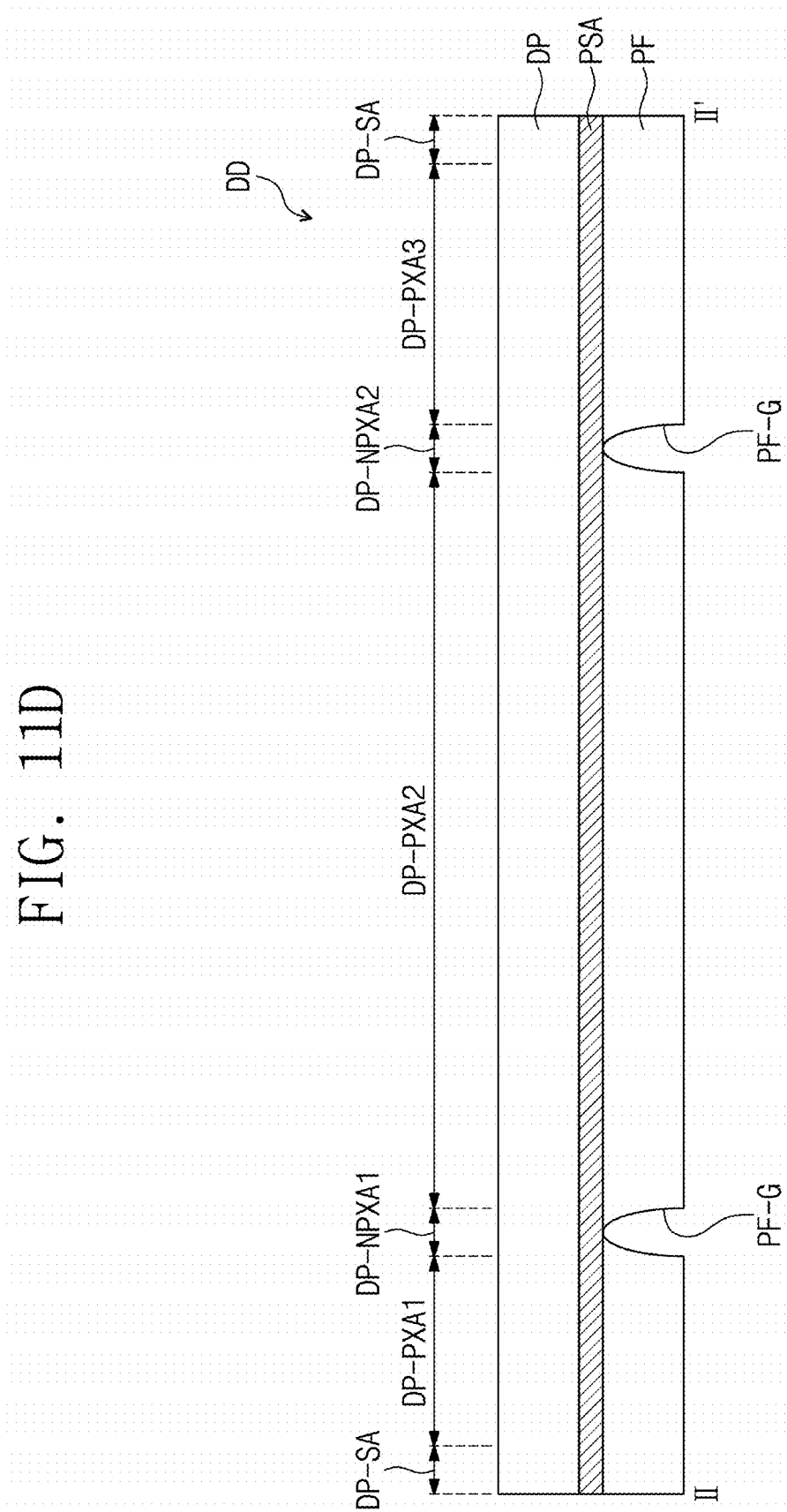
FIG. 11D is a cross-sectional view illustrating an exemplary embodiment of a display device according to the invention.

As shown in FIG. 11D, grooves PF-G may be defined in respective regions of the protection member PF corresponding to the first ineffective pixel region DP-NPXA1 and the second ineffective pixel region DP-NPXA2. As shown in FIG. 11B, the first display region DD-DA1 may be bent from the second display region DD-DA2 along the first non-display region DD-NDA1, and the third display region DD-DA3 may be bent from the second non-display region DD-NDA2 along the second non-display region DD-NDA2. The first non-display region DD-NDA1 and the second non-display region DD-NDA2 may have a predetermined curvature. Here, the grooves PF-G may be provided to be overlapped with such bending regions.

The grooves PF-G may be defined to reduce stress which may be exerted on the bending regions. Accordingly, it may be possible to prevent signal lines, which are provided in common on the first effective pixel region DP-PXA1, the second effective pixel region DP-PXA2, the third effective pixel region DP-PXA3, the first ineffective pixel region DP-NPXA1, and the second ineffective pixel region DP-NPXA2, from being cut.

FIG. 12 shows operation states of a display panel DP-R including ineffective pixel regions DP-NPXA, which were provided by the method described with reference to FIGS. 9A to 9D. Images of the display panel DP-R, in which white effective pixels, red effective pixels, green effective pixels, and blue effective pixels were selectively operated, are shown in FIG. 12. There was no light to be emitted through the ineffective pixel regions DP-NPXA, during operating the four groups of the effective pixels.

As shown in FIGS. 13A and 13B, the display device DD may include four bendable regions A1 to A4. The four bendable regions A1 to A4 may correspond to the first group of non-display regions in FIGS. 11A to 11C. A shape of the display device DD, in which the first group of non-display regions is used as the bending region, may be variously changed, as shown in FIGS. 13A and 13B.

According to some exemplary embodiments of the invention, a non-display region of a display device may be set using an ineffective pixel region of a display panel. Some of effective pixels may be inactivated, without changing the design of a display panel, and this method may be used to control a display region of a display device.

The ineffective pixel region of the display panel may be used as a bending region of the display device. Here, a groove may be provided to reduce a stress, which is exerted on the display device when the display device is bent. Thus, even when the display panel is bent, it may be possible to prevent signal lines, which are provided to cross the bending region, from being cut.

While exemplary embodiments of the invention have been particularly shown and described, it will be understood by one of ordinary skill in the art that variations in form and detail may be made therein without departing from the spirit and scope of the attached claims.

What is claimed is:

1. A display device, comprising:
    a display panel comprising a first region, in which effective pixels including an effective organic material are provided, a second region, in which ineffective pixels including an organic material that is denatured from the effective organic material of the effective pixels are provided, and a third region, in which a pixel is absent;
    a protection member which comprises a thermoplastic resin, is disposed on a rear surface of the display panel and defines a first groove corresponding to the second region; and
    an adhesive member between the protection member and the display panel.

2. The display device of claim 1, wherein each of the effective pixels and the ineffective pixels comprises an organic light emitting diode and a pixel driving circuit connected to the organic light emitting diode, and
    the pixel driving circuits of the effective pixels have a same structure as that of the pixel driving circuits of the ineffective pixels.

3. The display device of claim 1, wherein the thermoplastic resin comprises polyethylene terephthalate.

4. The display device of claim 1, wherein a portion of the rear surface of the display panel corresponding to the second region is exposed to an outside.

5. The display device of claim 1, wherein a second groove is defined in the adhesive member corresponding to the second region.

6. The display device of claim 1, wherein a rear surface of the protection member comprises a first rear region and a second rear region, between which the first groove is interposed, and
    the protection member further comprises a bump portion disposed adjacent to the first groove,
    wherein the bump portion is protruded from the first rear region and the second rear region.

7. The display device of claim 1, wherein the protection member comprises a first inner side surface and a second inner side surface defining the first groove, and the first inner side surface and the second inner side surface are inclined.

8. The display device of claim 1, wherein the display panel further comprises a fourth region, in which effective pixels are provided, and the second region is located between the first region and the fourth region.

9. The display device of claim 8, wherein the fourth region is bent from the first region.

10. The display device of claim 1, further comprising a window unit provided on the display panel,
wherein the window unit comprises a base film facing the protection member with the display panel interposed therebetween, and a light-blocking pattern, which is disposed on a rear surface of the base film, and
the light-blocking pattern is spaced apart from the second region in a plan view.

11. The display device of claim 1, wherein the first groove overlaps with a portion of the third region.

12. A display device, comprising:
a display panel comprising an effective pixel region, in which effective pixels including an effective organic material are provided, an ineffective pixel region, in which ineffective pixels including an organic material that is denatured from the effective organic material of the effective pixels are provided, and a peripheral region, in which a pixel is absent;
a protection member which is provided on a rear surface of the display panel and defines a groove corresponding to the ineffective pixel region; and
an adhesive member provided between the protection member and the display panel.

13. The display device of claim 12, wherein the effective pixel region comprises a first effective pixel region and a second effective pixel region, and
the ineffective pixel region is disposed between the first effective pixel region and the second effective pixel region.

14. The display device of claim 13, wherein the second effective pixel region is bent from the first effective pixel region.

15. The display device of claim 12, wherein the ineffective pixel region includes a line-shaped region extending in a predetermined direction.

16. The display device of claim 12, wherein the display panel comprises a base layer which is in contact with the protection member,
the base layer comprises a thermosetting resin, and
the protection member comprises a thermoplastic resin.

17. A method of fabricating a display device, the method comprising:
providing a preliminary display device comprising a display panel and a protection member provided on a rear surface of the display panel, the display panel comprising a pixel region, in which pixels are provided, and a peripheral region, in which the pixels are absent; and
pressing a portion of the protection member using a heating block to inactivate a predetermined number of pixels of the pixels, which are located in a region of the pixel region corresponding to the portion of the protection member.

18. The method of claim 17, wherein the protection member comprises a thermoplastic resin, and
the heating block is heated to a temperature higher than a sublimation temperature of the thermoplastic resin.

19. The method of claim 17, wherein the portion of the protection member is removed to define a groove, and
a bump portion is disposed on a rear surface of the protection member and adjacent to the groove, when the protection member is pressed by the heating block.

20. The method of claim 19, further comprising removing the bump portion, after the pressing the protection member using the heating block.

* * * * *